United States Patent
Fu et al.

(10) Patent No.: US 11,100,834 B2
(45) Date of Patent: Aug. 24, 2021

(54) GATE DRIVING SUB-CIRCUIT, DRIVING METHOD AND GATE DRIVING CIRCUIT

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Yishan Fu, Beijing (CN); Jun Fan, Beijing (CN); Fuqiang Li, Beijing (CN); Jiguo Wang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/622,756

(22) PCT Filed: Nov. 12, 2018

(86) PCT No.: PCT/CN2018/114997
§ 371 (c)(1),
(2) Date: Dec. 13, 2019

(87) PCT Pub. No.: WO2019/096083
PCT Pub. Date: May 23, 2019

(65) Prior Publication Data
US 2020/0160769 A1 May 21, 2020

(30) Foreign Application Priority Data
Nov. 15, 2017 (CN) .......................... 201711132896.9

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2310/0202* (2013.01);
(Continued)

(58) Field of Classification Search
CPC ................... G09G 3/3266; G09G 3/20; G09G 2310/0286; G09G 3/3674–3/3677; G11C 19/28
See application file for complete search history.

(56) References Cited

U.S. PATENT DOCUMENTS

2007/0296682 A1 12/2007 Hwang
2008/0266477 A1 10/2008 Lee et al.
(Continued)

FOREIGN PATENT DOCUMENTS

CN 101093649 A 12/2007
CN 101295481 A 10/2008
(Continued)

OTHER PUBLICATIONS

International Search Report and Written Opinion for Application No. PCT/CN2018/114997, dated Feb. 18, 2019, 11 Pages.

*Primary Examiner* — Xuemei Zheng
(74) *Attorney, Agent, or Firm* — Brooks Kushman P.C.

(57) ABSTRACT

A gate driving sub-circuit, a driving method and a gate driving circuit are provided. The gate driving sub-circuit includes an input signal end, a shift signal output end, an inverted phase shift signal output end, a positive phase shift clock signal input end, an inverted phase shift clock signal input end, a first control clock signal input end, a second control clock signal input end, a first gate driving signal output end, a second gate driving signal output end, a shift register circuit and a control output circuit. The control output circuit includes a first control output sub-circuit and a second control output sub-circuit.

16 Claims, 8 Drawing Sheets

(52) U.S. Cl.
CPC ............ *G09G 2310/0267* (2013.01); *G09G 2310/0286* (2013.01); *G09G 2330/028* (2013.01)

(56) References Cited

U.S. PATENT DOCUMENTS

| | | |
|---|---|---|
| 2011/0273408 A1 | 11/2011 | Ra et al. |
| 2013/0293529 A1* | 11/2013 | You .......................... G09G 3/20 345/212 |
| 2016/0189646 A1 | 6/2016 | Hong et al. |
| 2017/0200408 A1* | 7/2017 | Zhang .................... G11C 19/28 |
| 2020/0160769 A1 | 5/2020 | Fu et al. |

FOREIGN PATENT DOCUMENTS

| | | | |
|---|---|---|---|
| CN | 104966480 A * | 10/2015 | ............ G11C 19/28 |
| CN | 105741732 A | 7/2016 | |
| CN | 107767809 A | 3/2018 | |
| JP | 2012083599 A | 4/2012 | |

\* cited by examiner

GATE DRIVING SUB-CIRCUIT, DRIVING METHOD AND GATE DRIVING CIRCUIT

CROSS-REFERENCE TO RELATED APPLICATION

The present application claim a priority of the Chinese patent application No. 201711132896.9 filed on Nov. 15, 2017, which is incorporated herein by reference in its entirety.

TECHNICAL FIELD

The present disclosure relates to the field of display driving technology, in particular to a gate driving sub-circuit, a driving method and a gate driving circuit.

BACKGROUND

A memory integrated pixel unit in the related art includes two gate driving signal output ends, but the gate driving unit in the related art can only output one gate driving signal, cannot be used with the memory integrated pixel unit, and cannot be used for driving the two output ends of the memory integrated pixel unit to output mutually independent gate driving signals which do not interfere with each other.

SUMMARY

The present disclosure provides a gate driving sub-circuit, for driving a memory integrated pixel unit, comprising an input signal end, a shift signal output end, an inverted phase shift signal output end, a positive phase shift clock signal input end, an inverted phase shift clock signal input end, a first control clock signal input end, a second control clock signal input end, a first gate driving signal output end, a second gate driving signal output end, a shift register circuit and a control output circuit, wherein, the control output circuit comprise a first control output sub-circuit and a second control output sub-circuit; the shift register circuit is configured to obtain an inverted phase shift signal and a shift signal based on an input signal from the input signal end under the control of the positive phase clock signal input end, the inverted phase shift clock signal input end, and a positive phase enable end; the first control output sub-circuit is configured to generate a first gate driving signal based on the shift signal and the inverted phase shift signal under the control of the first control clock signal input end and the first enable end; and the second control output sub-circuit is configured to generate a second gate driving signal based on the shift signal and the inverted phase shift signal under the control of the second control clock signal input end and the inverted phase enable end, and the second gate driving signal is outputted through the second gate driving signal output end.

During implementing, the gate driving sub-circuit further includes a power voltage signal output end and a power voltage signal output circuit. wherein the power supply voltage signal output circuit is connected to the power supply voltage signal output end, the shift signal output end, and the second enable end, and configured to generate a power voltage signal based on the shift signal under the control of the second enable end, and the power voltage signal is outputted through the power voltage signal output end.

During implementing, the gate driving sub-circuit includes M control output circuits, M power voltage signal output circuits, M first control clock signal input ends, M second control clock signal input ends, M first gate driving signal output ends, M second gate driving signal output ends, and M power supply voltage signal output ends, wherein M is a positive integer; the first control output sub-circuit included in the control output circuit is connected to the first control clock signal input end and the first gate driving signal output end; the second control output sub-circuit included in the control output circuit is connected to the second control clock signal input end and the second gate driving signal output end; and the power voltage signal output circuit is connected to a power voltage signal output end.

During implementing, the shift register circuit includes: a first three-state gate, a positive phase control end thereof being connected to the inverted phase shift clock signal input end, an inverted phase control end thereof being connected to the positive phase shift clock signal input end, and an input end thereof being connected to the input signal end; a shift control transistor, a gate electrode thereof being connected to the positive phase enable end, a first electrode thereof being connected to an output end of the first three-state gate, and a second electrode thereof being connected to the first voltage input end; a first shift inverter, the input end thereof being connected to the output end of the first three-state gate; a second three-state gate, a positive phase control end thereof being connected to the positive phase shift clock signal input end, an inverted phase control end thereof being connected to the inverted phase shift clock signal input end, and the input end thereof being connected the output end of the shift inverter, and the output end thereof being connected to the output end of the first three-state gate; a NAND gate, a first input end thereof being connected to the positive phase shift clock signal input end, and the second input end thereof being connected to the output end of the first shift inverter; and a second shift inverter, an input end thereof being connected to the inverted phase shift end and the output end of the NAND gate, and an output end thereof being connected to the shift output end.

During implementing, the first control output sub-circuit includes: a first control output transmission gate, a positive phase control end thereof being connected to the shift signal output end, an inverted phase control end thereof being connected to the inverted phase shift signal output end, and an input end thereof being connected to the first control clock signal input end; a second control output transmission gate, the positive phase control end thereof being connected to the inverted phase shift signal output end, the inverted phase control end thereof being connected to the shift signal output end, and the input end thereof being connected to the first enable end; a first control output inverter, the input end thereof being connected to the output end of the first control output transmission gate and the output end of the second control output transmission gate; and a second control output inverter, the input end thereof being connected to the output end of the first control output inverter, and the output end thereof being connected to the first gate driving signal output end.

During implementing, the second control output sub-circuit includes: a third control output transmission gate, a positive phase control end thereof being connected to the shift signal output end, an inverted phase control end thereof being connected to the inverted phase shift signal output end, and an input end thereof being connected to the second control clock signal input end; a fourth control output transmission gate, a positive phase control end thereof being connected to the inverted phase shift signal output end, an inverted phase control end being connected to the shift signal output end, and the input end thereof being connected to the inverted phase enable end; a third control output inverter, an input end thereof being connected to the output end of the third control output transmission gate and the output end of the fourth control output transmission gate; and a fourth control output inverter, an input end thereof being connected to the output end of the third control output inverter, and an output end thereof being connected to the second gate driving signal output end.

During implementing, the power voltage signal output circuit includes: a power supply voltage signal output transmission gate, a positive phase control end thereof being connected to the shift signal output end, an inverted phase control end thereof being connected to the inverted phase shift signal output end, and an input end thereof being connected to the second enable end; a first power voltage signal output transistor, a gate electrode thereof being connected to the shift signal output end, a first electrode thereof being connected to the output end of the power voltage signal output transmission gate, and a second electrode thereof being connected to the first voltage input end; a power supply voltage signal output inverter, an input end thereof being connected to the output end of the power voltage signal output transmission gate; a second power voltage signal output transistor, a gate electrode thereof being connected to the output end of the power voltage signal output transmission gate, a first electrode thereof being connected to the second voltage input end, and a second electrode thereof being connected to the power voltage signal output end; and a third power voltage signal output transistor, a gate electrode thereof being connected to the output end of the power voltage signal output inverter, a first electrode thereof being connected to the first voltage input end, and a second electrode thereof being connected to the power voltage signal output end.

During implementing, the gate driving sub-circuit further includes an input circuit, wherein the input circuit is connected to a forward scan control end, a reverse scan control end, the positive phase shift signal end, the inverted phase shift signal end, and the input signal end, and is configured to control the positive phase shift signal end or the inverted phase shift signal end to be connected to the input signal end under the control of the forward scan control end and the reverse scan control end.

During implementing, the input circuit includes: a forward scan transmission gate, a positive phase control end thereof being connected to the forward scan control end, the inverted phase control end thereof being connected to the reverse scan control end, the input end there of being connected to the positive phase shift signal end, and the output end thereof being connected to the input signal end; and a reverse scan transmission gate, a positive phase control end thereof being connected to the reverse scan control end, an inverted phase control end thereof being connected to the forward scan control end, an input end thereof being connected to the inverted phase shift signal end, and an output end thereof being connected the input signal end.

In another aspect, a method of driving the gate driving sub-circuit includes: obtaining, by the shift register circuit, the inverted phase shift signal and the shift signal according to an input signal from the input signal end under the control of the clock signal input end and the positive phase enable end, the inverted phase shift signal being inverted to the shift signal phase; generating, by the first control output sub-circuit, a first gate driving signal according to the shift signal and the inverted phase shift signal under the control of the first control clock signal input end and the first enable end, and outputting the first gate driving signal through the first gate driving signal output end; and generating, by the second control output sub-circuit, a second gate driving signal according to the shift signal and the inverted phase shift signal under the control of the second control clock signal input end and the inverted phase enable end, and outputting the second gate driving signal through the second gate driving signal output end.

During implementing, the method further includes: generating, by the power voltage signal output circuit, a power voltage signal according to the shift signal under the control of the second enabling end, and outputting the power voltage signal through the power supply voltage signal output end.

In yet another aspect, a gate driving circuit includes a plurality of first gate driving modules arranged on a first side of a display panel and a second gate driving modules arranged on a second side of the display panel connected in a cascade manner, wherein, the first gate driving module comprises a plurality of gate driving sub-circuits connected in a cascade manner; the second gate driving module comprises a plurality of gate driving sub-circuits connected in a cascade manner; the gate driving sub-circuit included in the first gate driving module is connected to memory integrated pixel units located in odd-numbered rows, a gate driving sub-circuit included in the second gate driving module is connected to memory integrated pixel units located in even-numbered rows.

During implementing, the first side is a left side, and the second side is a right side; or the first side is the right side, and the second side is the left side; the positive phase shift clock signal input end of the shift register circuit in the first gate driving module is connected to the positive phase clock signal line, and the inverted phase shift clock signal input end of the shift register circuit in the first gate driving module is connected to the inverted phase clock signal line; the positive phase shift clock signal input end of the shift register circuit in the second gate drive module is connected to the inverted phase clock signal line, and the inverted phase shift clock signal input end of the shift register circuit in the second gate drive module is connected to the positive phase clock signal line; the gate driving sub-circuit further comprises a positive phase shift signal end, an inverted phase shift signal end and an input circuit, the input circuit is connected to a forward scan control end, a reverse scan control end, the positive phase shift signal end, the inverted phase shift signal end, and the input signal end, and is configured to control the positive phase shift signal end or the inverted phase shift signal end to be connected to the input signal end under the control of the forward scan control end and the reverse scan control end; and in the first gate driving module and the second gate driving module, other than the first stage of gate driving sub-circuit, the positive phase shift signal end of the current stage of gate driving sub-circuit is connected to a shift signal output end of an adjacent previous stage of gate driving sub-circuit; and other than the last stage of gate driving sub-circuit, the inverted phase shift signal end of the current stage of gate driving sub-circuit is connected to the shift signal output end of an adjacent next stage of gate driving sub-circuit.

During implementing, the gate driving sub-circuit comprises M power voltage signal output ends; M is a positive integer.

During implementing, when M is equal to 1, the nth stage of gate driving sub-circuit included in the first gate driving module includes a power voltage signal output end for supplying a power voltage signal to the memory integrated pixel units in the 2nth row; the nth gate driving sub-circuit included in the second gate driving module includes a power voltage signal output end for supplying a power voltage signal to the memory integrated pixel units in the (2n−1)th row, n is a positive integer.

During implementing, when M is equal to 2, the nth stage of gate driving sub-circuit included in the first gate driving module includes a first power voltage signal output end for supplying a power voltage signal to the memory integrated pixel units in the (4n−2)th row; the nth stage of gate driving sub-circuit included in the first gate driving module includes a second power voltage signal output end for supplying a power voltage signal to the memory integrated pixel units in the 4nth row; the first stage of gate driving sub-circuit included in the second gate driving module includes a power voltage signal output end for supplying a power voltage signal to the memory integrated pixel units in the (4n−3)th row; the second stage of gate drive sub-circuit included in the second gate driving module includes a supply voltage signal output for providing a supply voltage signal to the memory integrated pixel units in the (4n−1)th row, where n is a positive integer.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
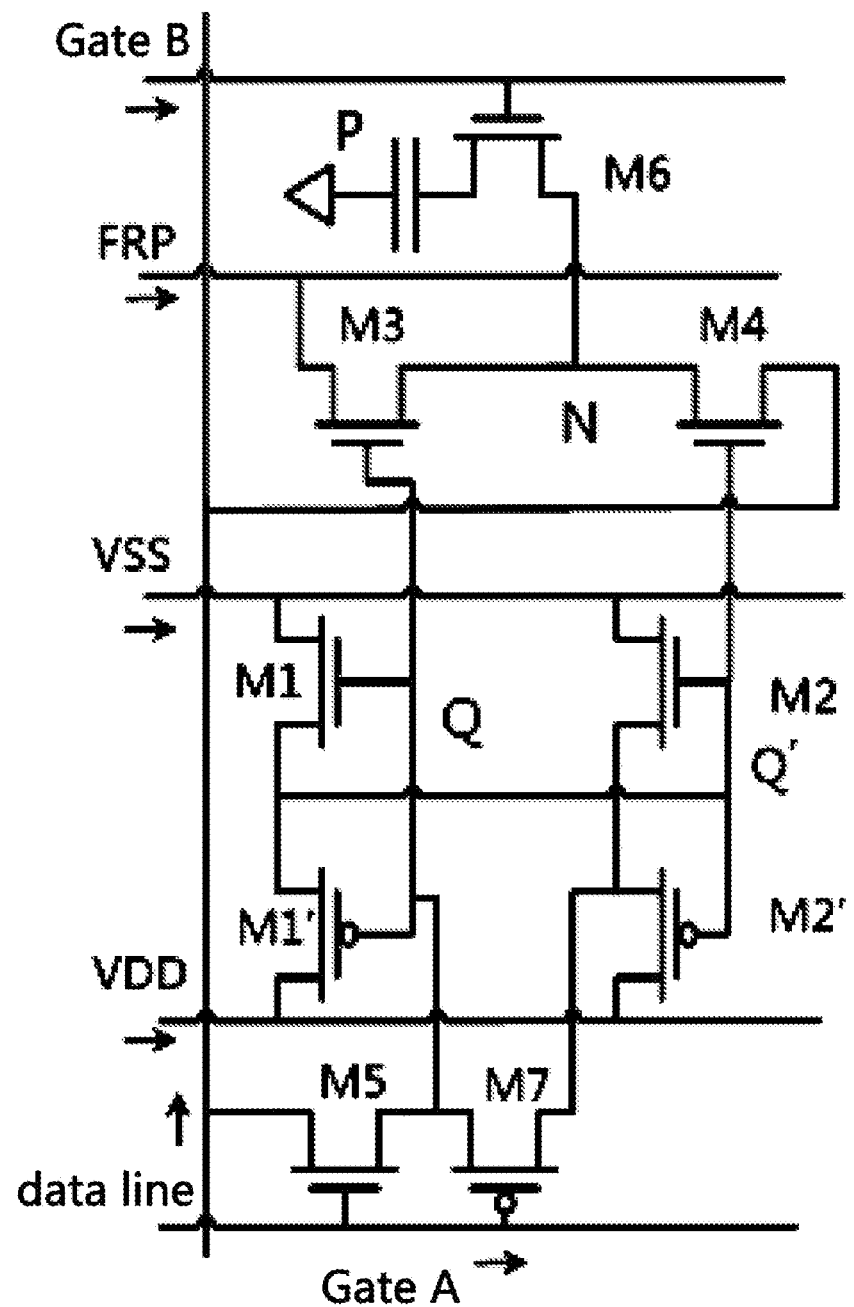
FIG. 1 is a circuit diagram of a MIP pixel unit in the related art.

As shown in FIG. 1, a memory integrated pixel unit in the related art includes a signal writing-in module, a latch, and a display module. In FIG. 1, reference numeral M1 represents a first n-type transistor, reference numeral M1' represents a first p-type transistor, reference numeral M2 represents a second n-type transistor, reference numeral M2' represents a second p-type transistor, reference numeral M3 represents a third transistor, reference numeral M4 represents a fourth transistor, reference numeral M5 represents a fifth transistor, reference numeral M6 represents a sixth transistor, and reference numeral M7 represents a seventh transistor. The signal writing-in module includes M5 and M7, and a gate electrode of M5 and a gate electrode of M7 are both connected to the first gate driving signal output end GateA. The latches include M1, M2, M1' and M2'. The display module includes M3, M4, and M6. In FIG. 1, reference numeral P represents a pixel electrode, reference numeral N represents a first node, reference numeral Q represents a positive node, and reference numeral Q' represents a negative node; a gate electrode of M6 is connected to a second gate driving signal output end GateB.

The memory integrated pixel unit shown in FIG. 1 includes two gate drive signal output ends. When the pixel signal is written, the pixel is not displayed, and when the pixel is displayed, no pixel signal is written. That is, GateA and GateB are separately driven in a time division manner. A high voltage VDD and a low voltage VSS are used for the latch. In FIG. 1, FRP is a normally black signal and Data is a data line. When the pixel signal is written, M5 is turned on, and the data voltage signal on the data line Data is written into the latch. If the data voltage signal is at a low level, the potential of Q is a low level, and the potential of Q' is a high level, M4 is turned on, the potential of N is the potential of the data voltage signal. If the data voltage signal on Data is at a high level, the potential of Q is a high level, the potential of Q' is a low level, M3 is turned on, the normally black signal FRP is applied to the first node N, and after the M6 is turned on under the control of GateB, the potential of the pixel electrode P is the potential of the first node N. The gate driving unit in the related art can only output one gate driving signal, cannot be used with the memory integrated pixel unit, and cannot provide two gate driving signals that are used for driving the memory integrated pixel unit and do not interfere with each other.

The embodiments of the present disclosure provide a gate driving sub-circuit, a driving method, and a gate driving circuit, which can solve the problem in the related art that the gate driving unit can only output one gate driving signal, and cannot be used with the memory integrated pixel unit, and cannot provide two gate driving signals that are used for driving the memory integrated pixel unit and do not interfere with each other.

Transistors employed in all embodiments of the present disclosure may each be a thin film transistor or a field effect transistor or other device having the same characteristics. In the embodiment of the present disclosure, in order to distinguish two electrodes of the transistor other than the gate electrode, one is referred to as a first electrode, and the other is referred to as a second electrode. In actual operation, the first electrode may be a drain electrode, and the second electrode may be a source electrode; or the first electrode may be a source electrode, and the second electrode may be a drain electrode.

Figure 2:
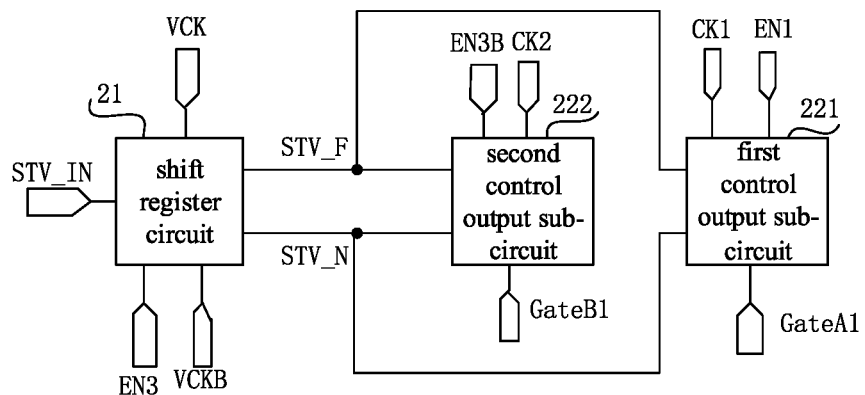
FIG. 2 is a structural diagram of a gate driving sub-circuit according to some embodiments of the present disclosure.

The gate driving sub-circuit of the embodiment of the present disclosure is configured to drive the memory integrated pixel unit. As shown in FIG. 2, the gate driving sub-circuit includes an input signal end STV_IN, a shift signal output end STV_N, and an inverted phase shift signal output end STV_F, a positive phase shift clock signal input end VCK, an inverted phase shift clock signal input end VCKB, a first control clock signal input end CK1, a second control clock signal input end CK2, a first gate driving signal output end GateA1, a second gate driving signal output end GateB1, a shift register circuit 21 and a control output circuit. The control output circuit includes a first control output sub-circuit 221 and a second control output sub-circuit 222.

The shift register circuit 21 is connected to the input signal end STV_IN, the shift signal output end STV_N, the inverted phase shift signal output end STV_F, the positive phase shift clock signal input end VCK, the inverted phase shift clock signal input end VCKB and a positive phase enable end EN3. The shift register circuit 21 is configured to obtain the inverted phase shift signal and the shift signal based on the input signal from the input signal end STV_IN under the control of the positive phase clock signal input end VCK, the inverted phase shift clock signal input end VCKB, and the positive phase enable end EN3, and the inverted phase shift signal is outputted through the inverted phase shift signal output end STV_F, and the shift signal is outputted through the shift signal output end STV_N.

The first control output sub-circuit 221 is connected to the shift signal output end STV_N, the inverted phase shift signal output end STV_F, the first control clock signal input end CK1, the first enable end EN1 and the first gate driving signal output end GateA1. The first control output sub-circuit 221 is configured to generate the first gate driving signal based on the shift signal and the inverted phase shift signal under the control of the first control clock signal input end CK1 and the first enable end EN1. The first gate driving signal is outputted through the first gate driving signal output end GateA1.

The second control output sub-circuit 222 is connected to the shift signal output end STV_N, the inverted phase shift signal output end STV_F, the second control clock signal input end CK2, the inverted phase enable end EN3B, and the second gate driving signal output end GateB1. The second control output sub-circuit 222 is configured to generate a second gate driving signal based on the shift signal and the inverted phase shift signal under the control of the second control clock signal input end CK2 and the inverted phase enable end EN3B. The second gate driving signal is outputted through the second gate driving signal output end GateB1.

In actual operation, the inverted phase shift signal and the shifted signal are inverted.

In a specific implementation, the shift signal may be delayed by a predetermined time period as compared with an input signal.

The gate driving sub-circuit of the embodiment of the present disclosure shifts the input signal from the input signal end STV_IN by using the shift register circuit 21 to obtain a shifted signal, and obtains the first gate driving signal and the second gate driving signal based on the shift signal by using the control output circuit including a first control output sub-circuit 221 and a second control output sub-circuit 222, so that a stage of first gate driving sub-circuit can be used to provide two gate drive signals for Memory Integrated Pixel (MIP), thereby implementing the writing and displaying of the MIP pixel unit. The gate driving sub-circuit of the embodiment of the present disclosure can be used in conjunction with the memory integrated pixel unit, and the two gate driving signal output ends of the memory integrated pixel unit connected to the two gate lines respectively can be independently output two gate driving signals by adjusting the timing. There is no interference between signal writing and display in the memory integrated pixel unit.

Figure 3:
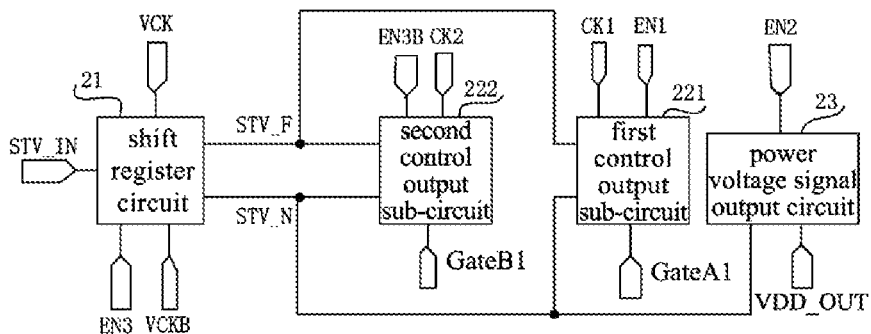
FIG. 3 is another structural diagram of a gate driving sub-circuit according to some embodiments of the present disclosure.

Optionally, as shown in FIG. 3, the gate driving sub-circuit further includes a power voltage signal output end VDD_OUT and a power voltage signal output circuit 23.

The power voltage signal output circuit 23 is connected to the power supply voltage signal output end VDD_OUT, the shift signal output end STV_N, and the second enable end EN2. The power voltage signal output circuit 23 is configured to generate a power voltage signal based on the shift signal under the control of the second enable end EN2, and the power voltage signal is outputted through the power voltage signal output end VDD_OUT.

In some embodiments, the gate driving sub-circuit of the embodiment of the present disclosure further includes a power voltage signal output end VDD_OUT and a power voltage signal output circuit 23 to provide a power voltage signal for the MIP pixel unit.

The gate driving sub-circuit of the embodiment of the present disclosure includes a shift register sub-circuit, a control output circuit, and a power supply voltage signal output circuit. The writing, displaying, and power supply for the MIP pixel are implemented by cooperation with the gate circuit and the clock signal, so as to avoid the competitive risk phenomenon when writing the pixel signal. The clock signal ensures that the gate drive signals are independently outputted without interfering to each other. The enable ends ensure the signal reset and fast power-down function of the gate driving sub-circuit, ensure displaying pre-written signal information by the pixel under the case of low frequency driving, without the start signal and the clock signal, and ensure the effective implementation of the MIP pixel unit function.

Optionally, the gate driving sub-circuit includes M control output circuits, M power voltage signal output circuits, M first control clock signal input ends, M second control clock signal input ends, M first gate driving signal output ends, M second gate driving signal output ends, and M power supply voltage signal output ends, where M is a positive integer. A first control output sub-circuit included in the control output circuit is connected to a first control clock signal input end and a first gate driving signal output end. A second control output sub-circuit included in the control output circuit is connected to a second control clock signal input end and a second gate drive signal output end. The power voltage signal output circuit is connected to a power voltage signal output end.

In some embodiments, the quantity of the control output circuit and the power supply voltage signal output circuit included in the gate driving sub-circuit of the embodiment of the present disclosure may be one or more than one, so that the gate driving sub-circuit can be used to drive more than one MIP pixel units. In actual operation, the waveform of the clock signal needs to be adjusted accordingly. Two MIP pixel units being driven by a gate driving sub-circuit is illustrated as follows.

Specifically, the shift register circuit may include: a first three-state gate, a positive phase control end thereof being connected to the inverted phase shift clock signal input end, an inverted phase control end thereof being connected to the positive phase shift clock signal input end, and an input end thereof being connected to the input signal end; a shift control transistor, a gate electrode thereof being connected to the positive phase enable end, a first electrode thereof being connected to an output end of the first three-state gate, and a second electrode thereof being connected to the first voltage input end; a first shift inverter, the input end thereof being connected to the output end of the first three-state gate; a second three-state gate, a positive phase control end thereof being connected to the positive phase shift clock signal input end, an inverted phase control end thereof being connected to the inverted phase shift clock signal input end, and the input end thereof being connected the output end of the shift inverter, and the output end thereof being connected to the output end of the first three-state gate; a NAND gate, a first input end thereof being connected to the positive phase shift clock signal input end, and the second input end thereof being connected to the output end of the first shift inverter; and a second shift inverter, an input end thereof being connected to the inverted phase shift end and the output end of the NAND gate, and an output end thereof being connected to the shift output end.

Figure 4:
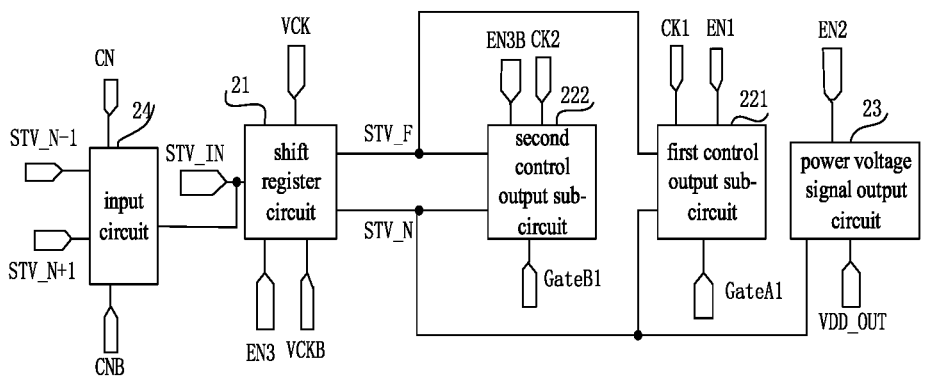
FIG. 4 is yet another structural diagram of a gate driving sub-circuit according to some embodiments of the present disclosure.

Specifically, as shown in FIG. 4, the gate driving sub-circuit may further include a positive phase shift signal end STV_N−1 and an inverted phase shift signal end STV_N+1;

As shown in FIG. 4, the gate driving sub-circuit of the embodiment of the present disclosure may further include an input circuit 24. The input circuit 24 is connected to a forward scan control end CN, a reverse scan control end CNB, the positive phase shift signal end STV_N−1, the inverted phase shift signal end STV_N+1, and the input signal end STV_IN. The input circuit 24 is configured to control the positive phase shift signal end STV_N−1 or the inverted phase shift signal end to be connected to the input signal end STV_IN under the control of the forward scan control end CN and the reverse scan control end CNB.

In a specific implementation, the positive phase shift signal end STV_N−1 is connected to a shift signal output end included in an adjacent previous-stage of gate driving sub-circuit.

The second inverted phase shift signal end STV_N+1 is connected to a shift signal output end included in an adjacent next-stage of gate drive sub-circuit.

Specifically, the input circuit may include: a forward scan transmission gate, a positive phase control end thereof being connected to the forward scan control end, the inverted phase control end thereof being connected to the reverse scan control end, the input end there of being connected to the positive phase shift signal end, and the output end thereof being connected to the input signal end; and a reverse scan transmission gate, a positive phase control end thereof being connected to the reverse scan control end, an inverted phase control end thereof being connected to the forward scan control end, an input end thereof being connected to the inverted phase shift signal end, and an output end thereof being connected the input signal end.

During the forward scan, the forward scan control end outputs a high level, the reverse scan control end outputs a low level, the forward scan transmission gate is turned on, the reverse scan transmission gate is turned off, and the positive phase shift signal end is connected to the input signal end. That is, the shift signal output end of the adjacent previous-stage of gate drive sub-circuit is connected to the input signal end.

During the reverse scan, the reverse scan control end outputs a high level, the forward scan control end outputs a low level, the reverse scan transmission gate is turned on, the forward scan transmission gate is turned off, and the reversed phase shift signal end is connected to the input signal end. That is, the shift signal output end of the adjacent next-stage of gate drive sub-circuit is connected to the input signal end.

Specifically, the first control output sub-circuit may include: a first control output transmission gate, a positive phase control end thereof being connected to the shift signal output end, an inverted phase control end thereof being connected to the inverted phase shift signal output end, and an input end thereof being connected to the first control clock signal input end; a second control output transmission gate, the positive phase control end thereof being connected to the inverted phase shift signal output end, the inverted phase control end thereof being connected to the shift signal output end, and the input end thereof being connected to the first enable end; a first control output inverter, the input end thereof being connected to the output end of the first control output transmission gate and the output end of the second control output transmission gate; and a second control output inverter, the input end thereof being connected to the output end of the first control output inverter, and the output end thereof being connected to the first gate drive signal output end.

The second control output sub-circuit includes: a third control output transmission gate, the positive phase control end thereof being connected to the shift signal output end, the inverted phase control end thereof being connected to the inverted phase shift signal output end, and the input end thereof being connected to the second control clock signal input end; a fourth control output transmission gate, the positive phase control end thereof being connected to the inverted phase shift signal output end, the inverted phase control end being connected to the shift signal output end, and the input end thereof being connected to the inverted phase enable end; a third control output inverter, the input end thereof being connected to the output end of the third control output transmission gate and the output end of the fourth control output transmission gate; and a fourth control output inverter, an input end thereof being connected to the output end of the third control output inverter, and the output end thereof being connected to the second gate drive signal output end.

Specifically, the power voltage signal output circuit may include: a power supply voltage signal output transmission gate, a positive phase control end thereof being connected to the shift signal output end, an inverted phase control end thereof being connected to the inverted phase shift signal output end, and an input end thereof being connected to the second enable end; a first power voltage signal output transistor, a gate electrode thereof being connected to the shift signal output end, a first electrode thereof being connected to an output end of the power voltage signal output transmission gate, and a second electrode thereof being connected to the first voltage input end; a power supply voltage signal output inverter, the input end thereof being connected to an output end of the power voltage signal output transmission gate; a second power voltage signal output transistor, a gate electrode thereof being connected to an output end of the power voltage signal output transmission gate, a first electrode thereof being connected to the second voltage input end, and a second electrode thereof being connected to the power voltage signal output end; and a third power voltage signal output transistor, a gate electrode thereof being connected to an output end of the power voltage signal output inverter, a first electrode thereof being connected to the first voltage input end, and a second electrode thereof being connected to the power voltage signal output end.

In actual operation, the first voltage may be a first high voltage, and the second voltage may be a second high voltage, but not limited thereto.

The gate driving sub-circuit of the present disclosure will be described as follows.

Figure 5:
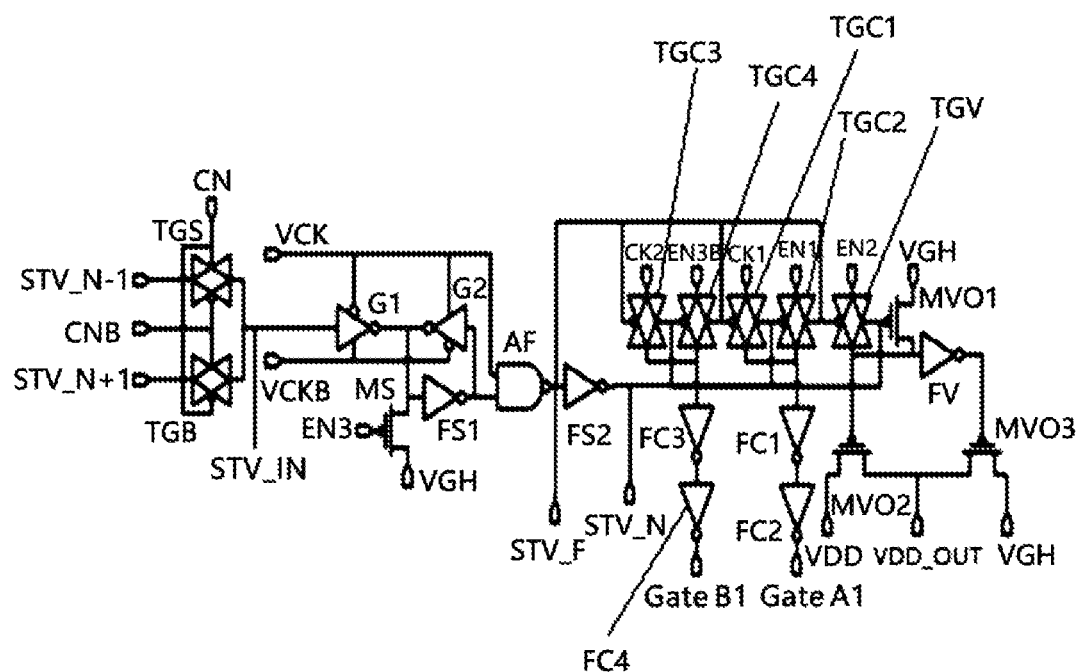
FIG. 5 is a circuit diagram of a gate driving sub-circuit according to some embodiments of the present disclosure.

As shown in FIG. 5, a specific implementation of the gate driving sub-circuit of the present disclosure includes a first input signal end STV_N−1, a second input signal end STV_N+1, a shift signal output end STV_N, and an inverted phase shift signal output end STV_F, a first control clock signal input end CK1, a second control clock signal input end CK2, a first gate driving signal output end GateA1, a second gate driving signal output end GateB1, a shift register circuit, a control output circuit, a power supply voltage signal output end VDD_OUT, a power supply voltage signal output circuit, and an input circuit. The control output circuit includes a first control output sub-circuit and a second control output sub-circuit.

The shift register circuit includes: a first three-state gate G1, an input end thereof being connected to the input signal end STV_IN, a positive phase control end thereof being connected to the inverted phase shift clock signal input end VCKB, and an inverted phase control end thereof being connected to the positive phase shift clock signal input end VCK; a shift control transistor MS, a gate electrode thereof being connected to the positive phase enable end EN3, a drain electrode thereof being connected to an output end of the first three-state gate G1, and a source electrode thereof being connected to and a first high voltage input end inputting a first high voltage VGH; a first shift inverter FS1, an input end thereof being connected to the output end of the first three-state gate G1; a second three-state gate G2, the positive phase control end thereof being connected to the positive phase shift clock signal input end VCK, and the inverting control end thereof being connected to the inverted phase shift clock signal input end VCKB, and the input end thereof being connected to the output end of the first shift inverter FS1, and an output end thereof being connected to an output end of the first three-state gate G1; a NAND gate AF, the first input end thereof being connected to the positive phase shift clock signal input end VCK, and the second input end thereof being connected to the output end of the first shift inverter FS1; and a second shift inverter FS2, an input end thereof being connected to the inverted phase shift signal output end STV_F and an output end of the NAND gate AF, and an output end thereof being connected to the shift signal output end STV_N.

The input circuit includes a forward scan transmission gate TGS and a reverse scan transmission gate TGB. A positive phase control end of the forward scan transmission gate TGS is connected to the forward scan control end CN, an inverted phase control end of the forward scan transmission gate TGS is connected to the reverse scan control end CNB, and the input end of the forward scan transmission gate TGS is connected to the first input signal end STV_N−1, and the output end of the forward scan transmission gate TGS is connected to the input signal end STV_IN; a positive phase control end of the reverse scan transmission gate TGB is connected to the reverse scan control end CNB, and an inverted phase control end of the reverse scan transmission gate TGB is connected to the forward scan control end CN, and the input end of the reverse scan transmission gate TGB is connected to the second input signal end STV_N+1, the output end of the reverse scan transmission gate TGB is connected to the input signal end STV_IN.

The first control output sub-circuit includes: a first control output transmission gate TGC1, a positive phase control end thereof being connected to the shift signal output end STV_N, an inverted phase control end thereof being connected to the inverted phase shift signal output end STV_F, an input end thereof being connected to the first control clock signal input end CK1; a second control output transmission gate TGC2, the positive phase control end thereof being connected to the inverted phase shift signal output end STV_F, the inverted phase control end thereof being connected to the shift signal output end STV_N, and the input end thereof being connected to the first enable end EN1; a first control output inverter FC1, an input end thereof being connected to an output end of the first control output transmission gate TGC1 and an output end of the second control output transmission gate TGC2; and a second control output inverter FC2, an input end thereof being connected to the output end of the first control output inverter FC1, and an output end thereof being connected to the first gate driving signal output end GateA1.

The second control output sub-circuit includes: a third control output transmission gate TGC3, a positive phase control end thereof being connected to the shift signal output end STV_N, an inverted phase control end thereof being connected to the inverted phase shift signal output end STV_F, and the input end thereof being connected to the second control clock signal input end CK2; a fourth control output transmission gate TGC4, a positive phase control end thereof being connected to the inverted phase shift signal output end STV_F, an inverted phase control end thereof being connected to the shift signal output end STV_N, the input end thereof being connected to the inverted phase enable end EN3B; a third control output inverter FC3, an input end thereof being connected to an output end of the third control output transmission gate TGC3 and an output end of the fourth control output transmission gate TGC4; and a fourth control output inverter FC4, an input end thereof being connected to the output end of the third control output inverter FC3, and an output end thereof being connected to the second gate driving signal output end GateB1.

The power voltage signal output circuit includes: a power supply voltage signal output transmission gate TGV, a positive phase control end thereof being connected to the shift signal output end STV_N, an inverted phase control end thereof being connected to the inverted phase shift signal output end STV_F, and the input end thereof being connected to the second enable end EN2; a first power voltage signal output transistor MVO1, a gate electrode thereof being connected to the shift signal output end STV_N, a source electrode thereof being connected to a first high voltage input end inputting the first high voltage VGH, and a drain electrode thereof being connected to the output end of the power source voltage signal output transmission gate TGV; a power supply voltage signal output inverter FV, in input end thereof being connected to the output end of the power voltage signal output transmission gate TGV; a second power voltage signal output transistor MVO2, a gate electrode thereof being connected to an output end of the power voltage signal output transmission gate TGV, a source electrode thereof being connected to a second high voltage input end inputting the second high voltage VDD, a drain electrode thereof being connected to the power source voltage signal output end VDD_OUT; and a third power voltage signal output transistor MVO3, a gate electrode thereof being connected to an output end of the power voltage signal output inverter FV, a drain electrode thereof being connected to the power voltage signal output end VDD_OUT, a source electrode thereof being connected to the first high voltage input end inputting the first high voltage VGH.

In the embodiment shown in FIG. 5, VGH is the power supply voltage, VDD is close to the maximum value of the data voltage on the data line, VDD is lower than VGH, and the voltage signal outputted by VDD_OUT is used to provide a voltage signal for the MIP pixel unit.

In the embodiment shown in FIG. 5, all of the transistors are p-type transistors, but in actual operation, the above transistors may be replaced with n-type transistors, and the types of transistors are not limited herein.

The gate driving sub-circuit of the present disclosure can be divided into three parts: a shift register circuit, a control output circuit and a power voltage signal output circuit. GateA1 and GateB1 provide two gate driving signals for a row of MIP pixel units. GateA1 is connected to the gate electrode of a writing-in transistor included in the MIP pixel unit, GateB1 is connected to the gate electrode of a display transistor included in the MIP pixel unit, and the VDD_OUT is connected to the power supply voltage signal input end of the MIP pixel unit.

A specific implementation of the gate driving sub-circuit as shown in FIG. 5 can be used to provide corresponding two gate driving signals for MIP pixel units in odd-numbered rows, and in actual operation, the gate driving sub-circuit for providing corresponding two gate driving signals for MIP pixel units in even-numbered rows is different from the above-described embodiment in that the first input end of the NAND gate AF is connected to the inverted phase shift clock signal input end VCKB and the positive phase control end VCK of the first three-state gate G1, the inverted phase control end of the first three-state gate G1 is connected to the VCKB, the positive phase control end of the second three-state gate G2 is connected to the VCKB, and the inverted phase control end of the second three-state gate G2 is connected to the VCK.

The gate driving sub-circuit described in some embodiments of the present disclosure may be a single-sided gate driving sub-circuit, and one stage of gate driving sub-circuit may be used for one row of MIP pixel units. In actual operation, a plurality of stages of gate driving sub-circuits arranged on the left side of the display panel can be used to drive MIP pixel units in odd-numbered rows, and a plurality of stages of gate driving sub-circuits arranged on the right side of the display panel can be used to drive MIP pixel units in even-numbered rows. Start signals and shift clock signals on both sides has a same phase. A clock signal of CLK1 and a clock signal of CLK2 have different phases on the left and right sides. There are four control output clock signal input ends for ensuring the gate driving signals on the left and right sides being outputted separately and not interfering to each other.

Figure 6:
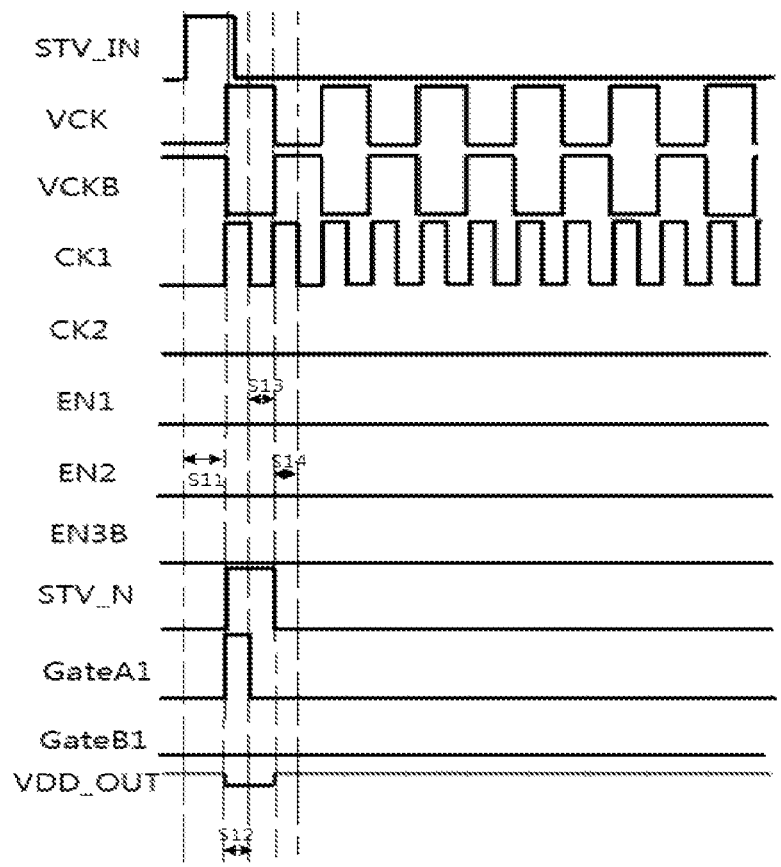
FIG. 6 is a time sequence diagram of the operation of the gate driving sub-circuit when a pixel signal is written in a first display mode according to some embodiments of the present disclosure.

As shown in FIG. 6, when the gate driving sub-circuit of the present disclosure is in operation, in a first display mode (the first display mode is a normal display mode, M4 in FIG. 1 is turned on, the data voltage on the data line Data is written to the pixel electrode under the control of GateB1, that is, the data voltage on Data is a low level during signal writing, the first display mode of the normal display screen is entered, and at this time, displaying is implemented according to the data voltage on Data in the display phase) and when the pixel signal is written, the following is implemented.

In a first input phase S11, STV_IN inputs a high level, the positive phase shift clock signal input end VCK inputs a low level, the inverted phase shift clock signal input end VCKB inputs a high level, and the positive phase enable end EN3 inputs a high level, so that the shift control transistor MS is turned off. The second three-state gate G2 is turned off, the first three-state gate G1 outputs a low level, and the first shift inverter FS1 outputs a high level, the NAND gate AF outputs a high level such that the inverted phase shift signal output end STV_F outputs a high level. The second shift inverter FS2 outputs a low level so that the shift signal output end STV_N outputs a low level. The first enable end EN1 outputs a low level, the first control output transmission gate TGC1 is turned off, and the second control output transmission gate TGC2 outputs a low level, the fourth control output inverter FC4 outputs a low level to the first gate driving signal output end GateA1. The second enabling end EN2 outputs a low level, and the power supply voltage signal output transmission gate TGV is turned off, the first power voltage signal output transistor MVO1 is turned on to apply the first high voltage VGH to the input end of the power voltage signal output inverter FV, and the output end of the power supply voltage signal output inverter FV outputting a low voltage, so that the second power supply voltage signal output transistor MVO2 is turned off, the third power supply voltage signal output transistor MVO3 is turned on, and the power voltage signal output end VDD_OUT outputs a first high voltage VGH.

In a first gate driving signal output phase S12, STV_IN inputs a low level, the positive phase shift clock signal input end VCK inputs a high level, and the inverted phase shift clock signal input end VCKB inputs a low level, the positive phase enable end EN3 inputs a high level to control the shift control transistor MS to be turned off. The potential of the input end of the first shift inverter FS1 is maintained at a low level, and the first shift inverter FS1 outputs a high level, the first three-state gate G1 is turned off, the second three-state gate G2 outputs a low level, and the NAND gate AF outputs a low level so that the inverted phase shift signal output end STV_F outputs a low level. The second shift inverter FS2 outputs a high level, so that the shift signal output end STV_N outputs a high level. The first enable end EN1 outputs a low level, the first control clock signal input end CK1 inputs a high level, the second control output transmission gate TGC2 is turned off, the first control output transmission gate TGC1 outputs a high level. The power supply voltage signal output transmission gate TGV outputs a low level, and the first power voltage signal output transistor MVO1 is turned off, the power supply voltage signal output inverter FV outputs a high level, the third power supply voltage signal output transistor MVO3 is turned off. The second power supply voltage signal output transistor MVO2 is turned on to control the power supply voltage signal output end VDD_OUT to be connected to the second high voltage input end inputting the second high voltage VDD, so that the power voltage signal output end VDD_OUT outputs the second high voltage VDD.

In a first reset phase S13, the STV_IN inputs a low level, the positive phase shift clock signal input end VCK inputs a high level, and the inverted phase shift clock signal input end VCKB inputs a low level, the positive phase enable end EN3 inputs a high level to control the shift control transistor MS to be turned off. The potential of the input end of the first shift inverter FS1 is maintained at a low level, the first shift inverter FS1 outputs a high level, the first three-state gate G1 is turned off, the second three-state gate G2 outputs a low level, and the NAND gate AF outputs a low level, so that the inverted phase shift signal output end STV_F outputs a low level. The second shift inverter FS2 outputs a high level, so that the shift signal output end STV_N outputs a high level. The first enable end EN1 outputs a low level, the first control clock signal input end CK1 inputs a low level, the second control output transmission gate TGC2 is turned off, the first control output transmission gate TGC1 outputs a low level. The power supply voltage signal output transmission gate TGV output a low level, the first power voltage signal output transistor MVO1 is turned off, the power source voltage signal output inverter FV outputs a high level, the third power voltage signal output transistor MVO3 is turned off. The second power voltage signal output transistor MVO2 is turned on to control the power voltage signal output end VDD_OUT to be connected to the second high voltage input end inputting the high voltage VDD such that the power voltage signal output end VDD_OUT outputs the second high voltage VDD.

In a first output cut-off maintenance phase S14, STV_IN inputs a low level, the positive phase shift clock signal input end VCK inputs a low level, and the inverted phase shift clock signal input end VCKB inputs a high level, the positive phase enable end EN3 inputs a high level to control the shift control transistor MS to be turned off. The second three-state gate G2 is turned off, the first three-state gate G1 outputs a high level, and the first shift inverter FS1 outputs a low level, the NAND gate AF outputs a high level, so that the inverted phase shift signal output end STV_F outputs a high level. The second shift inverter FS2 outputs a low level, so that the shift signal output end STV_N outputs a low level. The first enable end EN1 outputs a low level, and the first control clock signal input end CK1 inputs a high level, the first control output transmission gate TGC1 is turned off, the second control output transmission gate TGC2 outputs a low level. The power supply voltage signal output transmission gate TGV is turned off, and the first power supply voltage signal output transistor MVO1 is turned on to apply the first high voltage VGH to the input end of the power source voltage signal output inverter FV, and the output end of the power supply voltage signal output inverter FV outputting a low voltage, such that the second power supply voltage signal output transistor MVO2 is turned off, and the third power supply voltage signal output transistor MVO3 is turned on to make the power supply voltage signal output end VDD_OUT outputs a first high voltage VGH.

In actual operation, VCK and VCKB are used for the shift of two adjacent stages of gate driving units respectively. The pulse width of a clock signal from VCK and the pulse width of a clock signal from VCKB are twice the pulse width of a clock signal from CK1.

As shown in FIG. 6, in the first gate driving signal output stage S12, CK1 inputs a high level, CK2 inputs a low level, and GateA outputs a pulse signal, and writes a data voltage signal to the latch ring. After GateB is turned on in a subsequent frame (i.e., GateB1 outputs a pulse signal), and when GateA is turned on (i.e., GateA1 outputs a pulse signal), it is the signal written by the data line.

The power supply voltage signal output circuit at the right side of FIG. 5 is a design highlight, where VGH and VDD are input signals, VGH is the power supply voltage, VDD is close to a maximum value of the data voltage on the data line, and VDD is lower than the power supply voltage VGH.

As shown in FIG. 6, in the first gate driving signal output phase S12 and the first reset phase S13, the voltage value of the voltage signal outputted by VDD_OUT is close to the maximum value of the data voltage on the data line, lower than VGH. In other phases, the voltage supplied to the pixel by VDD_OUT is VGH. The advantage of this design is that, when the signal is written, the voltage difference between the gate electrode and the source electrode of M2' in FIG. 1 is not too large, so as to avoid a phenomenon of M5 in the MIP pixel unit shown in FIG. 1 that a low level signal should be written into the latch, but a high level signal is written into the latch due to the M5 being turned on, and a disorder occurs. Here, the addition of the power voltage signal output circuit can effectively prevent the problem that the signal written into latch signal is disordered and the pixel state is uncontrollable due to the competitive risk phenomenon when a signal is written into the latch ring inside the pixel structure.

Figure 7:
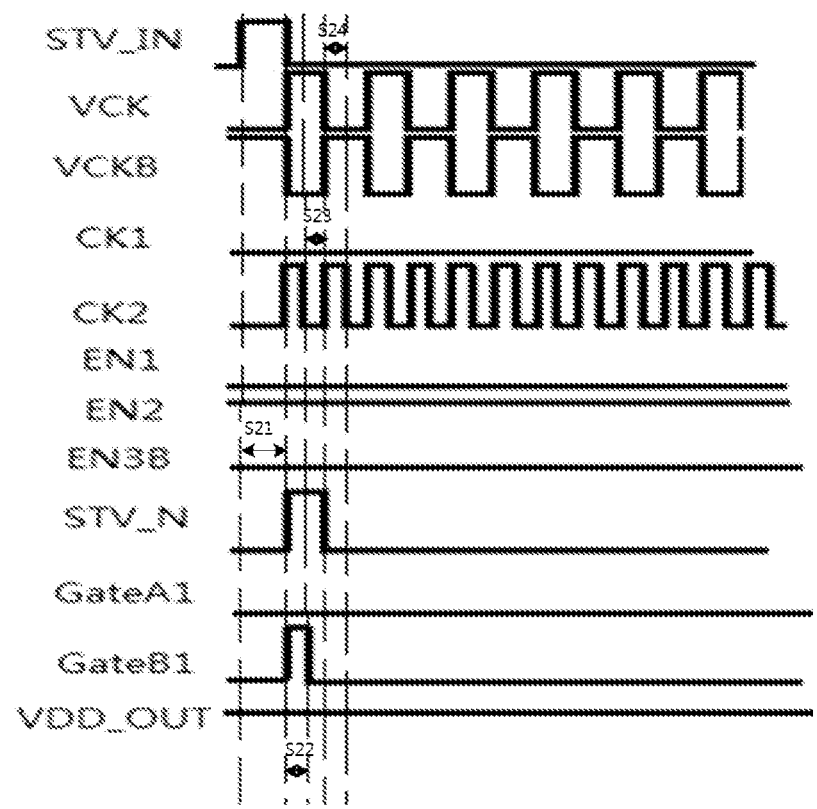
FIG. 7 is another time sequence diagram of the operation of the gate driving sub-circuit when a pixel signal is written in a first display mode according to some embodiments of the present disclosure.

As shown in FIG. 7, in the first display mode (the first display mode is the normal display mode, at this time, M4 in FIG. 1 is turned on, and the data voltage on the data line Data is written to the pixel electrode under the control of GateB1. That is, when the data voltage on the data is low when the signal is written, the first display mode of the normal display screen is entered, and at this time, the display voltage is displayed according to the data voltage on Data), when the pixel signal is displayed, the following is implemented.

In the second input phase S21, STV_IN inputs the first level, the positive phase shift clock signal input end VCK inputs a low level, the inverted phase shift clock signal input end VCKB inputs a high level, and the positive phase enable end EN3 inputs a high level, to control the shift control transistor MS to be turned off. The second three-state gate G2 is turned off, the first three-state gate G1 outputs a low level, and the first shift inverter FS outputs a high level, the NAND gate AF outputs a high level such that the inverted phase shift signal output end STV_F outputs a high level. The second shift inverter FS2 outputs a low level to make the shift signal output end STV_N outputs a low level. The first enable end EN1 outputs a low level, the first control output transmission gate TGC1 is turned off, and the second control output transmission gate TGC2 outputs a low level, the fourth control output inverter FC4 outputs a low level to the second gate driving signal output end GateB1 to make GateB1 output a low level. The power supply voltage signal output transmission gate TGV is turned off, the first power supply voltage signal output transistor MVO1 is turned on to apply the first high voltage VGH to the input end of the power supply voltage signal output inverter FV, and the power supply voltage signal output inverter FV outputs a low level to control the second power supply voltage signal output transistor MVO2 to be turned off, the third power supply voltage signal output transistor MVO3 is turned on, so that the power voltage signal output end VDD_OUT outputs a first high voltage VGH.

In the second gate driving signal output phase S22, STV_IN inputs a low level, the positive phase shift clock signal input end VCK inputs a high level, and the inverted phase shift clock signal input end VCKB inputs a low level, the positive phase enable end EN3 inputs a high level to control the shift control transistor MS to be turned off. The potential of the input end of the first shift inverter FS is maintained at a low level, and the first shift inverter FS1 outputs a high level, the first three-state gate G1 is turned off, the second three-state gate G2 outputs a low level, and the NAND gate AF outputs a low level so that the inverted phase shift signal output end STV_F outputs a low level. The second shift inverter FS2 outputs a high level such that the shift signal output end STV_N outputs a high level. The inverted phase shift signal output end FS outputs a low level, the shift signal output end STV_N outputs a high level, the inverted phase enable end EN3B outputs a low level, and the second control clock signal input end CK2 inputs a high level, the fourth control output transmission gate TGC4 is turned off, and the third control output transmission gate TGC3 outputs a high level to make GateB1 output a high level. The first power supply voltage signal output transistor MVO1 is turned off, the second enable end EN2 outputs a high level, and the power supply voltage signal output transmission gate TGV outputs a high level, the second power supply voltage signal output transistor MVO2 is turned off, the output end of the power supply voltage signal output inverter FV outputs a low level, and the third power supply voltage signal output transistor MVO3 is turned on, so that the power supply voltage signal output end VDD_OUT outputs the first high Voltage VGH.

In the second reset phase S23, STV_IN inputs a low level, the positive phase shift clock signal input end VCK inputs a high level, and the inverted phase shift clock signal input end VCKB inputs a low level, the positive phase enable end EN3 inputs a high level to control the shift control transistor MS to be turned off. The potential of the input end of the first shift inverter FS is maintained at a low level, and the first shift inverter FS1 outputs a high level, the first three-state gate G1 is turned off, the second three-state gate G2 outputs a low level, and the NAND gate AF outputs a low level, so that the inverted phase shift signal output end STV_F outputs a low level. The inverted phase enable end EN3B outputs a low level, the second control clock signal input end CK2 inputs a low level, the fourth control output transmission gate TGC4 is turned off, and the third control output transmission gate TGC3 outputs a low level to make GateB1 output a low level. The first power supply voltage signal output transistor MVO1 is turned off, the second enable end EN2 outputs a high level, and the power supply voltage signal output transmission gate TGV outputs a high level, the second power voltage signal output transistor MVO2 is turned off, the output end of the power supply voltage signal output inverter FOV output a low level, the third power voltage signal output transistor MVO3 is turned on, so that the power supply voltage signal output end VDD_OUT outputs a first high voltage VGH.

In the second output cut-off maintenance phase S24, STV_IN inputs a second level, the positive phase shift clock signal input end VCK inputs a low level, and the inverted phase shift clock signal input end VCKB inputs a high level, the positive phase enable end EN3 inputs a high level to control the shift control transistor MS to be turned off. The second three-state gate G2 is turned off, the first three-state gate G1 outputs a high level, the first shift inverter FS1 outputs a low level, and the NAND gate AF outputs a high level such that the inverted phase shift signal output end STV_F outputs a high level. The second shift inverter FS2 outputs a low level such that the shift signal output end STV_N outputs a low level. The inverted phase enable end EN3B outputs a low level, and the second control clock signal input end CK2 inputs a high level, the third control output transmission gate TGC3 is turned off, the fourth control output transmission gate TGC4 outputs a low level to make GateB1 output a low level. The power supply voltage signal output transmission gate TGV is turned off, and the first power supply voltage signal output transistor MVO1 is turned on to apply the first high voltage VH to the input end of the power supply voltage signal output inverter FV, and the power voltage signal output inverter FV outputs a low level to control the second power voltage signal output transistor MVO2 to be turned off, the third power voltage signal output transistor MVO3 is turned on, so that the power voltage signal output end VDD_OUT outputs the first high voltage VGH.

FIG. 7 shows a simulated output waveform of the gate driving sub-circuit when pixel is used for display. As shown in FIG. 7, in the second gate driving signal output phase S22, CK1 inputs a low level, CK2 inputs a high level, GateA outputs a low level, GateB1 outputs a pulse signal, and the pixel is used for displaying the state of the latch at a time point right before GateA is turned on. Therefore, at this time point, the signal is not written in and EN2 outputs a high level. At this time point, the voltage value of the power supply voltage signal outputted by VDD_OUT can be maintained at the first high voltage VGH, and it is not necessary to output a voltage close to the data voltage.

The gate driving sub-circuit of some embodiments of the present disclosure can output the first gate driving signal and the second gate driving signal in a time division manner, are these signals do not interfere with each other, and each gate driving signal has its independent enable signal. The enable signal has the following three functions. First, when the pixel is normally written or displayed, the enable signal has a reset function to ensure that the potential of the gate driving signal is restored to low level after the gate drive sub-circuit in the current stage is turned off. Second, during rapid discharging, the enable signal can pull up the potential of the gate driving signal to fully discharge. Third, when the MIP pixel unit needs to continuously display a high or low level written by GateA1, an integrated circuit (IC) is not necessary to provide a pulse signal, and GateB1 is turned on as long as the enable signal is maintained as a DC voltage signal during display.

The operation of the gate driving sub-circuit of the present disclosure as shown in FIG. 5 in the second display mode (i.e., a low frequency display mode) will be described below.

In the second display mode (the low frequency display mode), STV_IN inputs a low level, the positive phase shift clock signal input end VCK inputs a low level, the inverted phase shift clock signal input end VCKB inputs a low level, and the positive phase enable end EN3 inputs a low level to control the shift control transistor MS to be turned on such that a potential of an input end of the first shift inverter FS1 is a first high voltage VGH. The second three-state gate G2 is turned off, the first three-state gate G1 outputs a high level, the first shift inverter FS1 outputs a low level, and the NAND gate AF outputs a high level, so that the inverted phase shift signal output end STV_F outputs a high level. The second shift inverter FS2 outputs a low level, so that the shift signal output end STV_N outputs a second level. The first enable end EN1 outputs a low level, and the first control output transmission gate TGV1 is turned off, the second control output transmission gate TGC2 outputs a low level, so that the first gate driving signal output end GateA1 outputs a low level. The inverted phase enable end EN3B outputs a high level, the third control output transmission gate TGC3 is turned off, and the fourth control output transmission gate TGC4 outputs a high level so that GateB1 outputs a high level. The power supply voltage signal output transmission gate TGV is turned off, the first power supply voltage signal output transistor MVO1 is turned on, to apply the first voltage VGH to the input end of the power supply voltage signal output inverter FV, the second power voltage signal output transistor MVO2 is turned off, and the power voltage signal output inverter FV outputs a low level to control the third power voltage signal output transistor MVO3 to be turned on, so that the power supply voltage signal output end VDD_OUT outputs a first high voltage VGH.

In the second display mode, VCK, VCKB, CK1 and CK2 all input a low level, GateA1 outputs a low level, GateB1 outputs a high level, and VDD_OUT outputs VGH. That is, GateA1 writes a certain state to the pixel at a previous time point, and then the clock signal from STV and VCK, the clock signal from VCKB, the clock signal from CK1, and the clock signal from CK2 are not necessary, only the potential of the inverted phase enable signal from EN3B is kept high, GateB1 can still be turned on, and the pixel can still display the state written by GateA1 at the previous time point until GateA1 is turned on again at a next time point, and the state written in the pixel latch is changed. The biggest advantage in this display mode is to save power. The IC needs not output a pulse signal. It only needs to continuously supply DC signals such as the first high voltage VGH, the first low voltage VGL, the second high voltage VDD, the second low voltage VSS, and the inverted phase enable signal. The pixels may normally display by the pixel driving sub-circuit, and the pixel display effect can still be unaffected when the refresh frequency is extremely low.

When the pixel is quickly discharged, GateB1 is turned on, the shift register circuit is turned off, and the gate driving sub-circuit in the next stage is not quickly discharged by the gate driving sub-circuit in the current stage, rapid discharge is implemented by the enable signal. When discharging quickly, GateB1 is turned on, and its input and output waveforms are exactly the same as those displayed at low frequencies.

The driving method of the gate driving sub-circuit described in the embodiment of the present disclosure is applied to the above-mentioned gate driving sub-circuit, and the driving method of the gate driving sub-circuit includes: obtaining, by the shift register circuit, an inverted phase shift signal and a shift signal according to an input signal from the input signal end under the control of the clock signal input end and the positive phase enable end, the inverted phase shift signal is inverted to the shift signal phase; generating, by the first control output sub-circuit, a first gate driving signal according to the shift signal and the inverted phase shift signal under the control of the first control clock signal input end and the first enable end, and outputting the first gate driving signal through the first gate driving signal output end; and generating, by the second control output sub-circuit, a second gate driving signal according to the shift signal and the inverted phase shift signal under the control of the second control clock signal input end and the inverted phase enable end, and outputting the second gate driving signal through the second gate driving signal output end.

In a specific implementation, the shift signal may be delayed by a predetermined time period as compared to the input signal.

The driving method of the gate driving sub-circuit described in the embodiment of the present disclosure uses a shift register circuit to shift an input signal from an input signal end to obtain a shift signal, and adopts a control output circuit including a first control output sub-circuit and a second control output sub-circuit to obtain a first gate driving signal and a second gate driving signal according to the shift signal, so that the gate driving sub-circuit in one stage is used to provide two gate driving signals for the MIP pixel unit to implement writing and display of MIP pixel units. The driving method of the gate driving sub-circuit according to the embodiment of the present disclosure can be used in conjunction with the memory integrated pixel unit, and the two gate driving signal output ends of the memory integrated pixel unit connected to the two gate lines can be controlled by adjusting the timing to output independently, so that there is no interference between signal writing and display in the memory integrated pixel unit.

Optionally, the driving method of the gate driving sub-circuit of the embodiment of the present disclosure further includes: generating, by the power voltage signal output circuit, a power voltage signal according to the shift signal under the control of the second enabling end, and outputting the power voltage signal through the power supply voltage signal output end.

In some embodiments, the driving method of the gate driving sub-circuit further includes: supplying a power voltage signal to the MIP pixel unit through the power voltage signal output circuit.

According to a specific embodiment, the shift register circuit includes a first three-state gate, a shift control transistor, a first shift inverter, a second three-state gate, a NAND gate, and a second shift inverter.

In the first display mode, obtaining, by the shift register circuit, the inverted phase shift signal and the shift signal according to the input signal from the input signal end under the control of the clock signal input end and the positive phase enable end, including: in the first input phase and the second input phase, the potential of the input signal being the first level, the positive phase shift clock signal input end inputting the second level, and the inverted phase shift clock signal input end inputting the first level, a phase enable end inputting a first level to control the shift control transistor to be turned off; the second three-state gate being turned off, the first three-state gate outputting a second level, and the first shift inverter outputting a first level, the NAND gate outputting a first level such that the inverted phase shift signal output end outputs a first level; and the second shift inverter outputting a second level, so that the shift signal output end outputs a second level; in a first gate driving signal output phase, a first reset phase, a second gate driving signal output phase, and a second reset phase, a potential of the input signal being at a second level, and the positive phase shift clock signal input end inputting a first level, the inverted phase shift clock signal input end inputting a second level, and the positive phase enable end inputting a first level to control the shift control transistor to be turned off; the potential of the input end of the first shift inverter being maintained at a second level, the first shift inverter outputting a first level, the first three-state gate being turned off, and the second three-state gate outputting a second level, the NAND gate outputting a second level such that the inverted phase shift signal output end outputs a second level; the second shift inverter outputting a first level such that the shift signal output end outputting a first level; in the first output cut-off maintenance phase and the second output cut-off maintenance phase, the potential of the input signal being at a second level, and the positive phase shift clock signal input end inputting a second level, the inverted phase shift clock signal input end inputting a first level, the positive phase enable end inputting a first level to control the shift control transistor to be turned off; the second three-state gate being turned off, and the first three-state gate outputting a first level, the first shift inverter outputting a second level, and the NAND gate outputting a first level, such that the inverted phase shift signal output end outputs a first level; the second shift inverter outputting a second level such that the shift signal output end outputs a second level.

In the second display mode, the obtaining, by the shift register circuit, the inverted phase shift signal and the shift signal according to the input signal from the input signal end under the control of the clock signal input end and the positive phase enable end, including: the potential of the input signal being at a second level, the positive phase shift clock signal input end inputting a second level, the inverted phase shift clock signal inputting a second level, and the positive phase enabled end inputting a second level to control the shift control transistor to be turned on such that a potential of an input end of the first shift inverter is a first voltage; the second three-state gate being turned off, the first three-state gate outputting a first level, the first shift inverter outputting a second level, and the NAND gate outputting a first level such that the inverted phase shift signal output end outputting a first level; the second shift inverter outputting a second level such that the shift signal output end outputs a second level.

In actual operation, the first display mode is a normal display image mode, and in the first gate driving output phase, the first gate driving signal output end outputs a first level (in a specific implementation, the first level may be a high level, but not limited thereto), and the signal is written into the pixel in the first gate driving signal output phase; in the first input phase, the first reset phase, and the first output cutoff maintenance phase, the first gate driving signal output end outputs a second level (in a specific implementation, the second level may be a low level, but not limited thereto).

According to a specific embodiment, the first control output sub-circuit includes a first control output transmission gate, a second control output transmission gate, a first control output inverter, and a second control output inverter. The second control output sub-circuit includes a third control output transmission gate, a fourth control output transmission gate, a third control output inverter, and a fourth control output inverter. In the first display mode, the generating, by the first control output sub-circuit, a first gate driving signal according to the shift signal and the inverted phase shift signal under the control of the first control clock signal input end and the first enable end, outputting the first gate driving signal through the first gate driving signal output end, includes: in the first input phase, the inverted phase shift signal output end outputting a first level, the shift signal output end outputting a second level, and the first enable end outputting a second level, the first control output transmission gate being turned off, the second control output transmission gate outputting a second level, and the fourth control output inverter outputting a second level to the first gate driving signal output end; in the first gate driving signal output phase, the inverted phase shift signal output end outputting a second level, the shift signal output end outputting a first level, and the first enable end outputting a second level, the first control clock signal input end inputting a first level, the second control output transmission gate being turned off, and the first control output transmission gate outputting a first level; in the first reset phase, the inverted phase shift signal output end outputting a second level, the shift signal output end outputting a first level, and the first enable end outputting a second level, the first control clock signal input end inputting a second level, the second control output transmission gate being turned off, and the first control output transmission gate outputting a second level; in the first output cut-off maintenance phase, the inverted phase shift signal output end outputting a first level, the shift signal output end outputting a second level, and the first enable end outputting a second level, the first control clock signal input end inputting a first level, the first control output transmission gate being turned off, and the second control output transmission gate outputting a second level.

In the first display mode, the generating, by the second control output sub-circuit, a second gate driving signal according to the shift signal and the inverted phase shift signal under the control of the second control clock signal input end and the inverting enable end and outputting the second gate driving signal through the second gate driving signal output end includes: in the second input stage, the inverted phase shift signal output end outputting a first level, the shift signal output end outputting a second level, and the first enable end outputting a second level, the first control output transmission gate being turned off, the second control output transmission gate outputting a second level, and the fourth control output inverter outputting a second level to the first gate driving signal output end; in the second gate driving signal output stage, the inverted phase shift signal output end outputting a second level, the shift signal output end outputting a first level, and the inverted phase enable end outputting a second level, the second control clock signal input end inputting a first level, the fourth control output transmission gate being turned off, and the third control output transmission gate outputting a first level; in the second reset phase, the inverted phase shift signal output end outputting a second level, the shift signal output end outputting a first level, and the inverted phase enable end outputting a second level, the second control clock signal input end inputting a second level, the fourth control output transmission gate being turned off, and the third control output transmission gate outputting a second level; in the second output cut-off maintenance phase, the inverted phase shift signal output end outputting a first level, the shift signal output end outputting a second level, and the inverted phase enable end outputting a second level, the second control clock signal input end inputting a first level, the third control output transmission gate being turned off, and the fourth control output transmission gate outputting a second level.

In the second display mode, the generating, by the first control output sub-circuit, a first gate driving signal according to the shift signal and the inverted phase shift signal under the control of the first control clock signal input end and the first enable end and outputting the first gate driving signal through the first gate driving signal output end includes: the inverted phase shift signal output end outputting a first level, the shift signal output end outputting a second level; the first enable end outputting a second level, and the first control output transmission gate being turned off, the second control output transmission gate outputting a second level such that the first gate driving signal output end outputs a second level; the inverted phase enable end outputting a first level, the third control output transmission gate being turned off, and the fourth control output transmission gate outputting a first level such that the second gate driving signal output end outputting the first level.

In actual operation, the first display mode is a normal display image mode, and in the second gate driving output stage, the second gate driving signal output end outputs a first level (in a specific implementation, the first level may be a high level, but not limited thereto), and the pixel signal display is implemented at the second gate driving signal output phase. In the second input phase, the second reset phase, and the second output cutoff maintenance phase, the second gate driving signal output end outputs a second level (in a specific implementation, the second level may be a low level, but not limited thereto).

In actual operation, the second display mode is a low frequency display mode, and in the second display mode, the first gate driving signal output end outputs a second level (in a specific implementation, the second level may be a low level, but not limited thereto), the second gate driving signal output end outputs a first level (in a specific implementation, the first level may be a high level, but not limited thereto) That is, the normal black signal FRP in FIG. 1 is read when GateB1 is turned on (that is, the display time in the low frequency display mode).

According to a specific embodiment, the power voltage signal output circuit includes a power voltage signal output transmission gate, a first power voltage signal output transistor, a power voltage signal output inverter, a second power voltage signal output transistor, and a third power voltage signal output transistor.

In the first display mode, the generating, by the power voltage signal output circuit, a power voltage signal according to the shift signal under the control of the second enable end, and outputting the power voltage signal through the power voltage signal output end includes: in the first input phase and the first output cut-off maintenance phase, the second enable end outputting a second level, the inverted phase shift signal output end outputting a first level, and the shift signal output end outputting a second level, the power voltage signal output transmission gate being turned off, and the first power voltage signal output transistor being turned on to control an input end of the power voltage signal output inverter to be connected to the first voltage, the output end of the voltage signal output inverter outputting a second voltage such that the second power voltage signal output transistor is turned off, and the third power voltage signal output transistor being turned on, so that the power voltage signal output end outputs the first voltage; in the first gate driving signal output phase and the first reset phase, the second enable end outputting a second level, and the inverted phase shift signal output end outputting a second level, the shift signal output end outputting a first level, the power supply voltage signal output transmission gate outputting a second level, the first power supply voltage signal output transistor being turned off, and the power supply voltage signal output inverter outputting a first level, the third power voltage signal output transistor being turned off; the second power voltage signal output transistor being turned on to control the power voltage signal output end to be connected to the second voltage input end, so that the power voltage signal output end outputs the second voltage; in the second input phase and the second output cut-off maintenance phase, the inverted phase shift signal output end outputting a first level, and the shift signal output end outputting a second level, the power supply voltage signal output transmission gate being turned off, the first power voltage signal output transistor being turned on, so that the input end of the power voltage signal output inverter is connected to the first voltage, and the power voltage signal output inverter outputting the second level to control the second power voltage signal output transistor to be turned off, the third power voltage signal output transistor being turned on, so that the power voltage signal output end outputs a first voltage; in the second gate driving signal output phase and the second reset phase, the inverted phase shift signal output end outputting a second level, and the shift signal output end outputting a first level, the first power supply voltage signal output transistor being turned off, the second enable end outputting a first level, the power supply voltage signal output transmission gate outputting a first level, and the second power supply voltage signal output transistor being turned off, the output end of the power supply voltage signal output inverter outputting a second level, and the third power voltage signal output transistor being turned on, so that the power voltage signal output end outputs the first voltage.

In the second display mode, the generating, by the power voltage signal output circuit, a power voltage signal according to the shift signal under the control of the second enable end, and outputting the power voltage signal through the power voltage signal output end, includes: the inverted phase shift signal output end outputting a first level, the shift signal output end outputting a second level, the power supply voltage signal output transmission gate being turned off, and the first power supply voltage signal output transistor being turned on to make the input end of the power voltage signal output inverter to be connected to a first voltage, the second power voltage signal output transistor being turned off, and the power voltage signal output inverter outputting a second level to control the third power voltage signal output transistors to be turned on so that the power voltage signal output end outputs the first voltage.

In actual operation, the first voltage may be a first high voltage VGH, and the second voltage may be a second high voltage VDD (VDD is close to a maximum value of a data voltage on a data line), but not limited thereto.

In a specific implementation, in the first display mode, when the signal is written into the pixel, in the first gate driving signal output phase and the first reset phase, the voltage value of the voltage signal outputted by the power voltage signal output end is close to the maximum value of the data voltage on the data line. VDD is lower than VGH. In other phases, the voltage supplied to the MIP pixel unit by the output end of the power supply voltage signal is VGH. Through the above voltage design, when the signal is written in the pixel, the voltage difference between the gate electrode and the source electrode of M2' in FIG. 1 is not excessively large, so as to avoid the phenomenon of M5 in the MIP pixel unit shown in FIG. 1 that the low-level signal should be written in the latch, but a high-level signal is written into the latch due to M5 being turned on, and a disorder occurs. Here, the addition of the power voltage signal output circuit can effectively prevent the problem that the signal written into latch signal is disordered and the pixel state is uncontrollable due to the competitive risk phenomenon when a signal is written into the latch ring inside the pixel structure.

Figure 8:
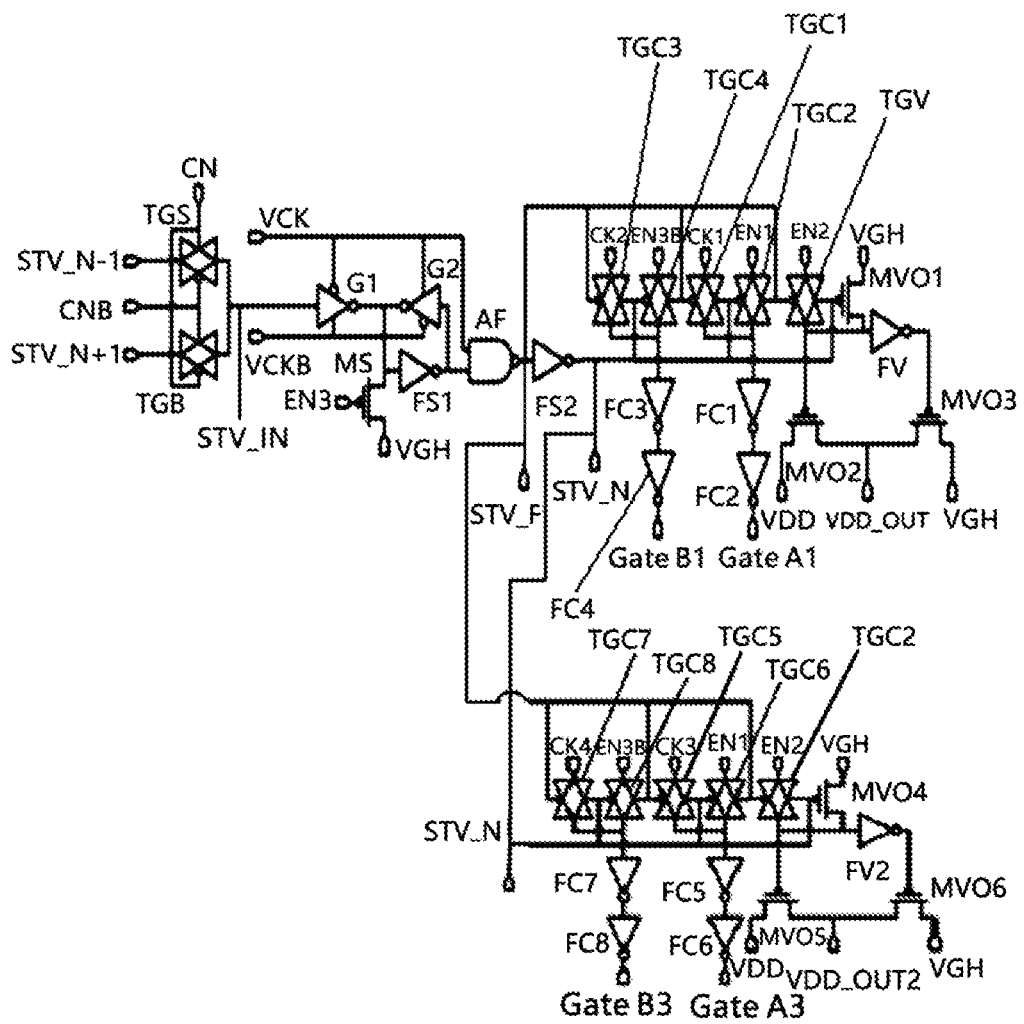
FIG. 8 is another circuit diagram of the gate driving sub-circuit according to some embodiments of the present disclosure.

As shown in FIG. 8, another specific embodiment of the gate driving sub-circuit of the present disclosure adds the second control output circuit and the second power voltage signal output circuit to the gate driving sub-circuit of the present disclosure as shown in FIG. 5.

As shown in FIG. 8, the second control output circuit includes the first control output sub-circuit and a second control output sub-circuit.

The first control output sub-circuit includes: a fifth control output transmission gate TGC5, the positive phase control end thereof being connected to the shift signal output end STV_N, the inverted phase control end thereof being connected to the shift inversion signal output end STV_F, and the input end thereof being connected to the third control clock signal input end CK3; a sixth control output transmission gate TGC6, the positive phase control end thereof being connected to the inverted phase shift signal output end STV_F, the inverted phase control end thereof being connected to the shift signal output end STV_N, and the input end thereof being connected to the first enable end EN1; a fifth control output inverter FC5, the input end thereof being connected to an output end of the fifth control output transmission gate TGC5 and an output end of the sixth control output transmission gate TGC6; a sixth control output inverter FC6, an input end thereof being connected to an output end of the fifth control output inverter FC5, and an output end thereof being connected to the third gate drive signal output end GateA3.

The second control output sub-circuit includes: a seventh control output transmission gate TGC7, the positive phase control end thereof being connected to the shift signal output end STV_N, and the inverted phase control end being connected to the inverted phase shift signal output end STV_F, the input end thereof being connected to the fourth control clock signal input end CK4; an eighth control output transmission gate TGC8, the positive phase control end thereof being connected to the shift inversion signal output end STV_F, the inverted phase control end thereof being connected to the shift signal output end STV_N, the input end thereof being connected to the inverted phase enable end EN3B; a seventh control output inverter FC7, the input end thereof being connected to an output end of the seventh control output transmission gate TGC7 and an output end of the eighth control output transmission gate TGC8; and an eighth control output inverter FC8, an input end thereof being connected to an output end of the seventh control output inverter FC7, and an output end thereof being connected to the fourth gate driving signal output end GateB3.

The second power voltage signal output circuit includes: a second power voltage signal output transmission gate TGV2, the positive phase control end thereof being connected to the shift signal output end STV_N, and the inverted phase control end thereof being connected to the shift inversion signal output end STV_F, the input end thereof being connected to the second enable end EN2; a fourth power voltage signal output transistor MVO4, a gate electrode thereof being connected to the shift signal output end STV_N, a source electrode thereof being connected to the first high voltage input end inputting the first high voltage VGH, and a drain electrode thereof being connected to the output end of the second power voltage signal output transmission gate TGV2; a second power voltage signal output inverter FV2, the input end thereof being connected to the output end of the second power voltage signal output transmission gate TGV2; a fifth power voltage signal output transistor MVO5, a gate electrode thereof being connected to an output end of the second power voltage signal output transmission gate TGV2, a source electrode thereof being connected to a second high voltage input end inputting the second high voltage VDD, a drain electrode thereof being connected to the second power supply voltage signal output end VDD_OUT2; and a sixth power supply voltage signal output transistor MVO6, a gate electrode thereof being connected to an output end of the second power voltage signal output inverter FV2, a drain electrode thereof being connected to the second power voltage signal output end VDD_OUT2, a source electrode thereof being connected to the first high voltage input end inputting the first high voltage VGH.

The specific implementation of the gate driving sub-circuit shown in FIG. 8 can be used to drive two rows of MIP pixel units. In actual operation, when more control output circuits and power supply voltage signal output circuits are used, one stage of gate drive sub-circuit may correspond to four rows of MIP pixel units, and even more rows of MIP pixel units. When one stage of gate driving sub-circuit corresponds to four rows of MIP pixel units, the structure of the gate driving sub-circuits in odd-numbered rows is different from the structure of the gate driving sub-circuits in even-numbered rows.

The structure of the gate driving sub-circuit for driving the MIP pixel units in odd-numbered rows is as shown in FIG. 8. The difference between the structure of the gate driving sub-circuit for driving the MIP pixel units in even-numbered rows and the structure of the gate driving sub-circuit shown in FIG. 8 is in that the positive phase control end of the first three-state gate G1 is connected to VCK, the inverted phase control end of the first three-state gate G1 is connected to the VCKB, the positive phase control end of the second three-state gate G2 is connected to VCKB, and the inverted phase control end of the second three-state gate G2 is connected to VCK, and the first input end of the NAND gate AF is connected to VCKB.

Figure 9:
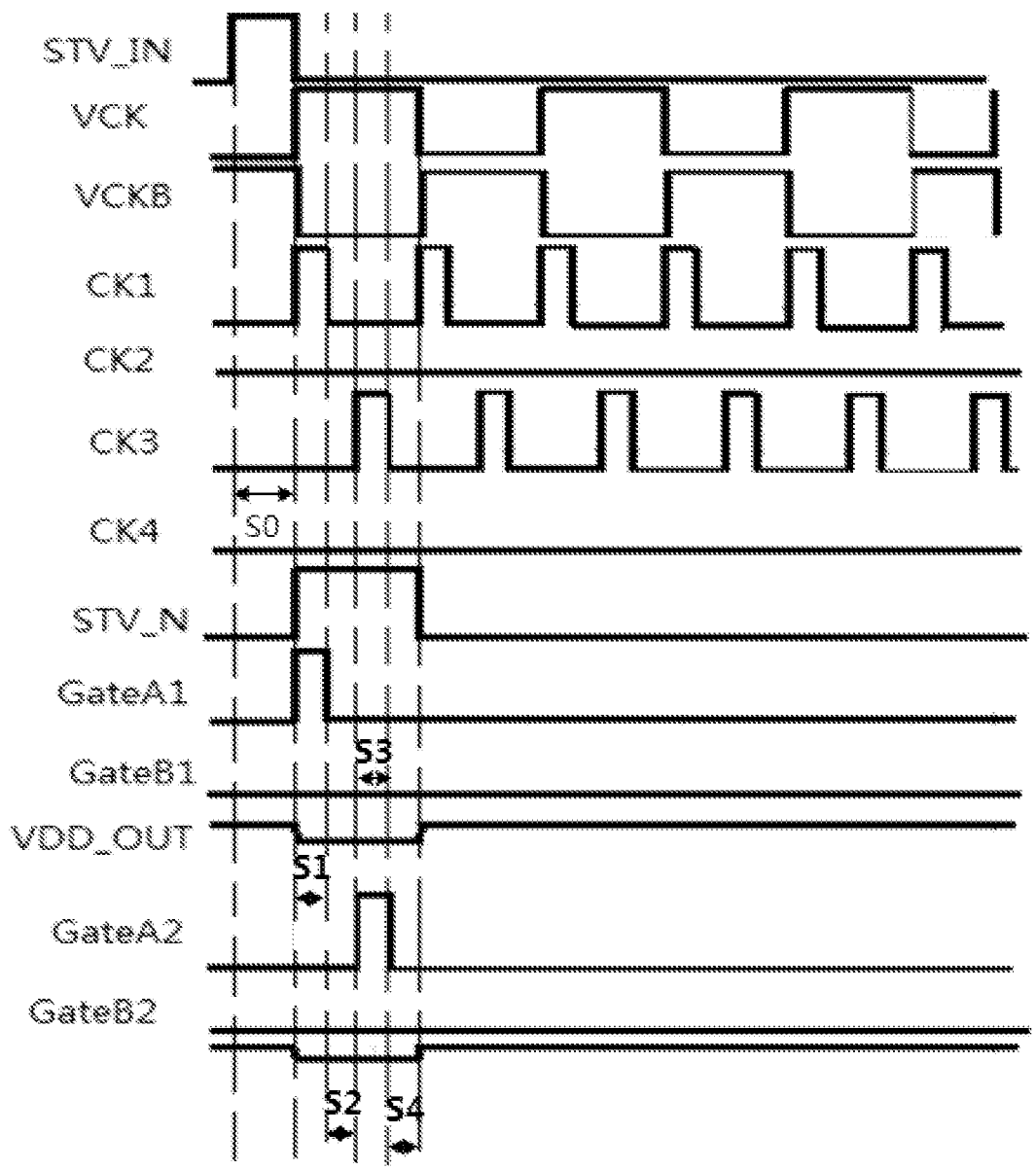
FIG. 9 is a time sequence diagram of the operation of the gate driving sub-circuit when a pixel signal is written in a first display mode according to some embodiments of the present disclosure.

As shown in FIG. 9, when the gate driving sub-circuit shown in FIG. 8 is in operation, in the first display mode, when a plurality of rows of driving pixels are written, in the input phase S0, STV_IN inputs a high level; in the first output phase S1, STV_IN inputs a low level, GateA1 outputs a high level, and GateB1, GateA3, and GateB3 all output a low level; in the first reset phase S2, STV_IN inputs a low level, and GateA1, GateB1, GateA3, and GateB3 all output a low level; in the second output phase S3, STV_IN inputs a low level, GateA3 outputs a high level, and GateA1, GateB1, and GateB3 all output a low level; in the second reset phase S4, STV_IN inputs a low level, and GateA1, GateB1, GateA3, and GateB3 all output a low level; in the first output phase S1, the first reset phase S2, the second output phase S3, and the second reset phase S4, STV_N outputs a high level; in the first output phase S1, the first reset phase S2, the second output phase S3, and the second reset phase S4, both VDD_OUT and VDD_OUT2 output VDD; in other phases, both VDD_OUT and VDD_OUT2 output VGH.

FIG. 9 is a simulated diagram of a gate driving sub-circuit for driving four rows of MIP pixel units in a pixel writing state, that is, GateA is turned on, and a GateB1 is turned off. As shown in FIG. 9, the pulse width of a signal outputted by each stage of the gate drive sub-circuit to the next stage of shift signal output end STV_N is the same as the pulse width of the positive phase shift clock signal from VCK, but the pulse width of the first control clock signal from CK1 and the pulse width of the second control clock signal from CK2 is changed to ¼ of the pulse width of the positive phase shift clock signal from VCK. However, when one stage of gate driving sub-circuit is used to drive two rows of the MIP pixel units, the pulse width of the first control clock signal input from CK1 and the pulse width of the second control clock signal from CK2 is ½ of the pulse width of the positive phase shift clock signal from VCK.

When each stage of gate driving sub-circuit drives four rows of MIP pixel units, the gate driving sub-circuit described in the embodiment of the present disclosure still maintains all functions when each stage of gate driving sub-circuit drives two rows of MIP pixel units. A series of functions such as high-frequency image display, low-frequency image display, and fast discharge can also be realized. When the gate drive sub-circuit is changed from driving two rows of MIP pixel units to four rows of MIP pixel units, the quantity of required gate drive sub-circuits is halved at a same resolution, which facilitate the realization of a narrow frame.

The gate driving circuit of the embodiment of the present disclosure includes a plurality of first gate driving modules arranged on a first side of the display panel and a second gate driving modules arranged on a second side of the display panel connected in a cascade manner. The first gate driving module includes a plurality of gate driving sub-circuits connected in a cascade manner. The second gate driving module includes a plurality of gate driving sub-circuits connected in a cascade manner. The gate driving sub-circuit included in the first gate driving module is connected to memory integrated pixel units located in odd-numbered rows, a gate driving sub-circuit included in the second gate driving module is connected to memory integrated pixel units located in even-numbered rows.

In actual operation, the first side may be a left side, and the second side may be a right side; or the first side may be a right side, and the second side may be the left side.

The positive phase shift clock signal input end of the shift register circuit in the first gate driving module is connected to the positive phase clock signal line, and the inverted phase shift clock signal input end of the shift register circuit in the first gate driving module is connected to the inverted phase clock signal line; the positive phase shift clock signal input end of the shift register circuit in the second gate drive module is connected to the inverted phase clock signal line, and the inverted phase shift clock signal input end of the shift register circuit in the second gate drive module is connected to the positive phase clock signal line.

The input signal end in the gate driving sub-circuit includes a first input signal end and a second input signal end; the shift register circuit in the gate driving sub-circuit includes a forward scan transmission gate and a reverse scan transmission gate.

In the first gate driving module, other than the first stage of gate driving sub-circuit, the first input signal end of the current stage of gate driving sub-circuit is connected to a shift signal output end of an adjacent previous stage of gate driving sub-circuit; and other than the last stage of gate driving sub-circuit, the second input signal end of the current stage of gate driving sub-circuit is connected to the shift signal output end of an adjacent next stage of gate driving sub-circuit.

In the second gate driving module, other than the first stage of gate driving sub-circuit, the first input signal end of the current stage of gate driving sub-circuit is connected to the shift signal output end of an adjacent previous stage of gate driving sub-circuit; other than the last stage of gate driving sub-circuit, the second input signal end of the current stage of gate driving sub-circuit is connected to the shift signal output end of the adjacent next stage of gate driving sub-circuit.

Specifically, the gate driving sub-circuit may include M power voltage signal output ends; M is a positive integer. When M is equal to 1, the nth stage of gate driving sub-circuit included in the first gate driving module includes a power voltage signal output end for supplying a power voltage signal to the memory integrated pixel units in the 2nth row. The nth gate driving sub-circuit included in the second gate driving module includes a power voltage signal output end for supplying a power voltage signal to the memory integrated pixel units in the (2n−1)th row. When M is equal to 2, the nth gate driving sub-circuit included in the first gate driving module includes a first power voltage signal output end for supplying a power voltage signal to the memory integrated pixel units in the (4n−2)th row; the nth stage of gate driving sub-circuit included in the first gate driving module includes a second power voltage signal output end for supplying a power voltage signal to the memory integrated pixel units in the 4nth row; the first stage of gate driving sub-circuit included in the second gate driving module includes a power voltage signal output end for supplying a power voltage signal to the memory integrated pixel units in the (4n−3)th row; the second stage of gate drive sub-circuit included in the second gate driving module includes a supply voltage signal output for providing a supply voltage signal to the memory integrated pixel units in the (4n−1)th row, where n is a positive integer.

When the gate driving sub-circuit includes M power voltage signal output ends, the gate driving sub-circuit includes M control output circuits, M power voltage signal output circuits, M first control clock signal input ends, and M second control clock signal input ends, M first gate driving signal output ends, and M second gate driving signal output ends.

The gate drive circuit of the present disclosure will be described below by two specific embodiments.

Figure 10:
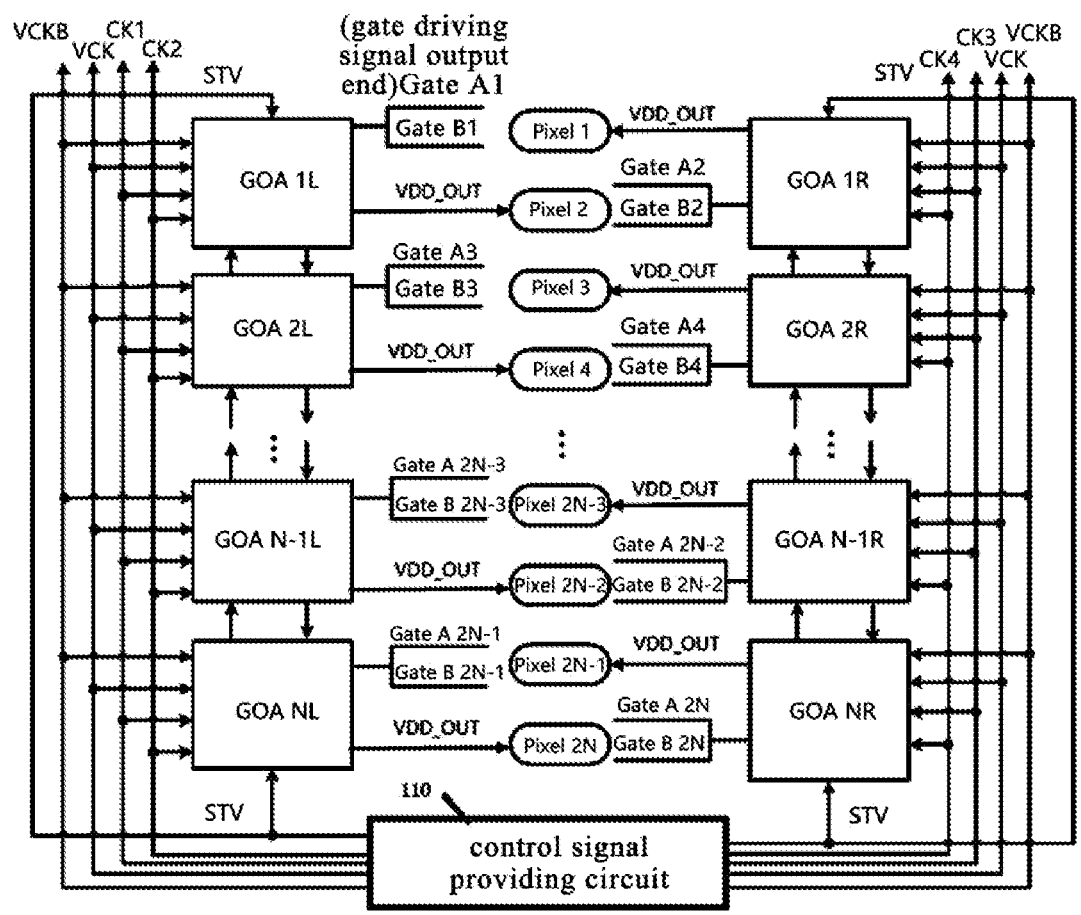
FIG. 10 is a structural diagram of a gate driving circuit according to some embodiments of the present disclosure.

As shown in FIG. 10, in the gate driving circuit of the present disclosure, the gate driving sub-circuit is driven at a single side, and the first gate driving signal and the second gate driving signal outputted by a same stage of gate driving sub-circuit are used to drive the MIP pixel units in a same row, and the power voltage signal output end of the current stage of gate driving sub-circuit outputs the signal to the MIP pixel units driven by the gate driving sub-circuit at the other side.

In actual operation, the gate driving sub-circuit for driving the MIP pixel units in odd-numbered rows may be arranged on the left side of the display panel, and the gate driving sub-circuit for driving the MIP pixel units in even-numbered rows may be arranged on the right side of the display panel. The gate driving sub-circuit in the left side and the gate driving sub-circuit in the right side arranged in the same row control two rows of MIP pixel units, and provide the gate driving signal and the power voltage signal for the latches for the two rows of MIP pixel units.

In FIG. 10, GOA1L indicates a gate driving sub-circuit in a first row at the left side of the display panel for driving the first row of MIP pixel units Pixel1. GOA1R indicates a gate driving sub-circuit in a first row at the right side of the display panel for driving the second row of MIP pixel units Pixel2.

The power supply voltage signal from VDD_OUT included in GOA1L is supplied to the second row of MIP pixel units Pixel2; the power supply voltage signal from VDD_OUT included in GOA1R is supplied to the first row of MIP pixel units PPixel1.

GOA2L indicates the gate drive sub-circuit in the second row at the left side of the display panel for driving the third row of MIP pixel units Pixel3; GOA2R indicates the gate driving sub-circuit in the second row at the right side of the display panel for driving the fourth row of MIP pixel units Pixel4. The power supply voltage signal from VDD_OUT included in GOA2L is supplied to the fourth row of MIP pixel units Pixel4; the power supply voltage signal from VDD_OUT included in GOA2R is supplied to the third row of MIP pixel units Pixel3.

GOAN−1L indicates the gate driving sub-circuit in the N−1th row at the left side of the display panel for driving the (2N−3)th row of MIP pixel unit Pixel2N−3; GOAN−1R indicates the gate driving sub-circuit in the (N−1)th row at the right side for driving the (2N−2)th row of MIP pixel units Pixel2N−2. The power supply voltage signal from VDD_OUT included in GOAN−1L is supplied to the (2N−2)th row of MIP pixel units Pixel2N−2; the power supply voltage signal from VDD_OUT included in GOAN−1R is supplied to the (2N−3)th row of MIP pixel units Pixel2N−3.

GOANL indicates the gate driving sub-circuit in the Nth row at the left side of the display panel for driving the (2N−1)th row of MIP pixel units Pixel2N−1; GOANR indicates the gate driving sub-circuit in the Nth row at the right side of the display panel for driving the 2Nth row of MIP pixel units Pixel2N. The power supply voltage signal from VDD_OUT included in GOANL is supplied to the 2Nth row MIP pixel units Pixel2N; the power supply voltage signal from VDD_OUT included in GOANR is supplied to the power supply voltage signal input end Pixel2N−1 of the (2N−1)th row of MIP pixel units.

In FIG. 10, GateA1 is the first gate driving signal output end included in GOA1L, GateB1 is the second gate driving signal output end included in GOA1L, GateA2 is the first gate driving signal output end included in GOA1R, and GateB2 is the second gate driving signal output end included in GOA1R. GateA3 is a first gate driving signal output end included in GOA2L, GateB3 is a second gate driving signal output end included in GOA2L; and GateA4 is a first gate driving signal output end included in GOA2R, GateB4 is a second gate driving signal output end included in GOA2R; GateA2N−3 is the first gate drive signal output end of GOAN−1L, GateB2N−3 is the second gate drive signal output end of GOAN−1L; GateA2N−2 is the first gate drive signal output end included in GOAN−1R, GateB2N−2 is a second gate drive signal output end included in GOAN−1R; GateA2N−1 is the first gate driving signal output end of GOANL, GateB2N−1 is the second gate driving signal output end of GOANL; GateA2N is the first gate driving signal output end of GOANR, and GateB2N is a second gate drive signal output end included in GOANR; where N is an integer greater than 3.

In FIG. 10, CK1 denotes the first control clock signal input end (connected to the gate driving sub-circuit at the left side) and CK2 denotes the second control clock signal input end (connected to the gate driving sub-circuit on the left side), CK3 denotes the third control clock signal input end (connected to the gate driving sub-circuit at the right side), and CK4 denotes the fourth control clock signal input end (connected to the gate driving sub-circuit at the right side), STV denotes the start signal, VCK denotes the positive phase shift clock signal input end, and VCKB denotes the input end of the inverted phase shift clock signal. The control signal providing circuit 110 provides the above clock signal and the start signal STV, and the start signal STV is supplied to the input signal end of GOA1L and the input signal end of GOA1R.

Figure 11:
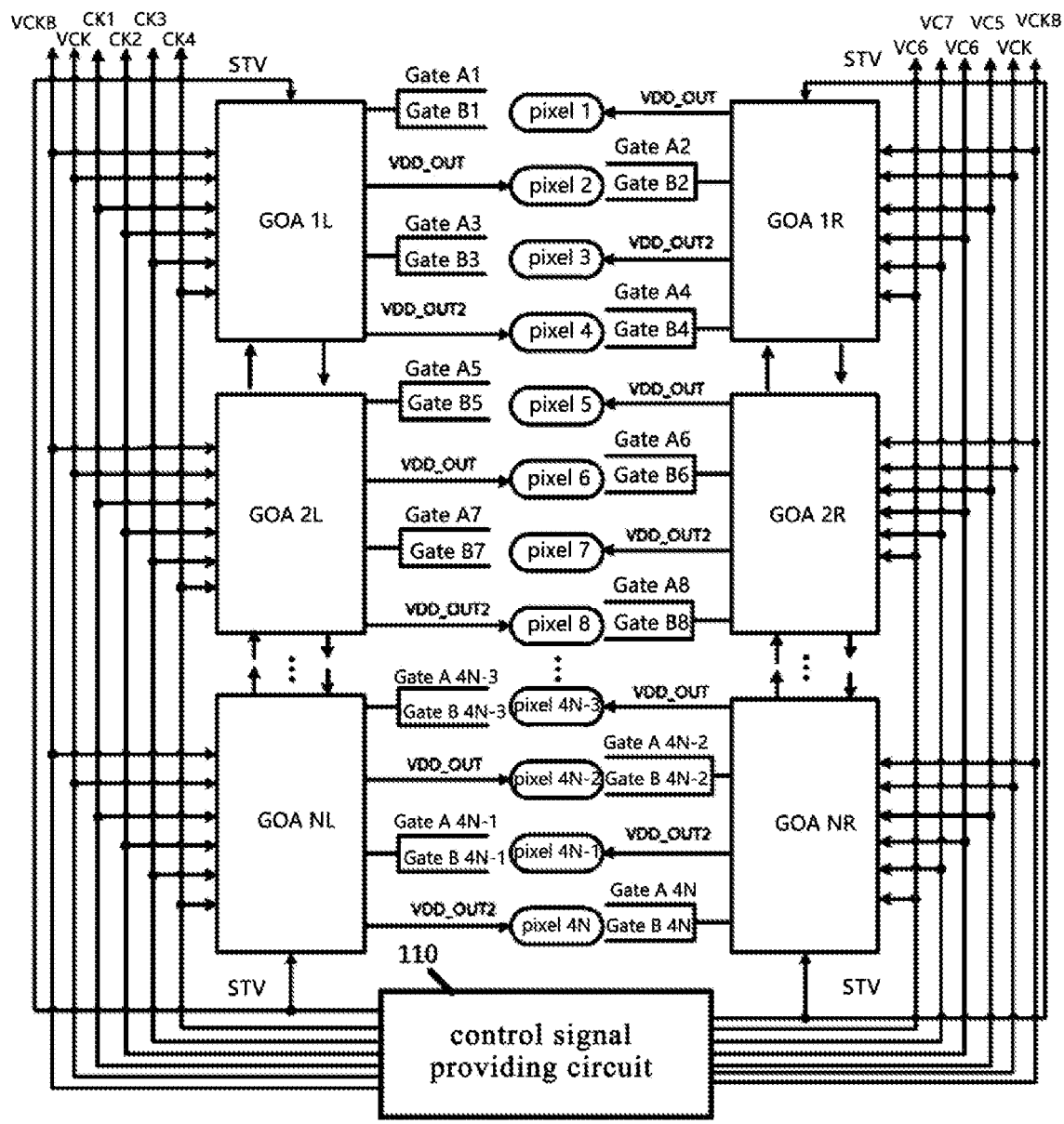
FIG. 11 is another structural diagram of the gate drive circuit according to some embodiments of the present disclosure.

As shown in FIG. 11, in the gate driving circuit of another embodiment of the present disclosure, the gate driving sub-circuit is driven at a single side, and the first gate driving signal and the second gate driving signal outputted by a same stage of the gate driving sub-circuit are used to drive one row of MIP pixel units, and the third gate driving signal and the fourth gate driving signal outputted by a same stage of gate driving sub-circuit are used to drive another row of MIP pixel units. The two power voltage signal output ends of the gate driving sub-circuit output signals to two rows of MIP pixel units driven by the gate driving sub-circuit at the other side.

In actual operation, the gate driving sub-circuit for driving the MIP pixel units in odd-numbered rows may be arranged on the left side of the display panel, and the gate driving sub-circuit for driving the MIP pixel units in even-numbered rows may be arranged on the right side of the display panel. The gate driving sub-circuit in the left side and the gate driving sub-circuit in the right side arranged in the same row control four rows of MIP pixel units, and provide the gate driving signal and the power voltage signal for the latches for the four rows of MIP pixel units.

In FIG. 11, GOA1L indicates a gate driving sub-circuit in a first row at a left side of the display panel for driving a first row of MIP pixel units Pixel1 and a third row of MIP pixel units Pixel3; GOA1R indicates a gate driving sub-circuit in the first row at the right side of the display panel for driving the second row of MIP pixel units Pixel2 and the fourth row of MIP pixel units Pixel4. The first power supply voltage signal from VDD_OUT1 included in GOA1L is supplied to the second row of MIP pixel units Pixel2; the second power supply voltage signal from VDD_OUT2 included in GOA1L is supplied to the fourth row of MIP pixel units Pixel4. The first power supply voltage signal from VDD_OUT1 included in GOA1R is supplied to the first row of MIP pixel units Pixel1; the second power supply voltage signal from VDD_OUT2 included in GOA1R is supplied to the third row of MIP pixel units Pixel3.

GOA2L indicates the gate driving sub-circuit in the second row at the left side of the display panel for driving the fifth row of MIP pixel units Pixel5 and the seventh row of MIP pixel units Pixel7; the GOA2R indicates the gate driving sub-circuit in the second row at the right side of the display panel for driving a sixth row of MIP pixel units Pixel6 and an eighth row of MIP pixel units Pixel8. The first power supply voltage signal from VDD_OUT1 included in GOA2L is supplied to the sixth row of MIP pixel units Pixel6; the second power supply voltage signal from VDD_OUT2 included in GOA2L is supplied to the eighth row of MIP pixel units Pixel8. The first power supply voltage signal from VDD_OUT1 included in GOA2R is supplied to the fifth row of MIP pixel units Pixel5; the second power supply voltage signal from VDD_OUT2 included in GOA2R is supplied to the seventh row of MIP pixel units Pixel7.

GOANL indicates the gate driving sub-circuit in the Nth row at the left side of the display panel for driving the (4N−3)th row MIP pixel unit Pixel4N−3 and the (4N−1)th row MIP pixel unit Pixel4N−1; the GOANR indicates the gate driving sub-circuit in the Nth row at the right side of the display panel for driving the (4N−2)th row of MIP pixel units Pixel4N−2 and the 4Nth row of MIP pixel units Pixel4N. The first power supply voltage signal from VDD_OUT1 included in GOANL is supplied to the (4N−2)th row of MIP pixel units Pixel4N−2; the second power supply voltage signal from VDD_OUT2 included in GOA2L is supplied to the 4Nth row of MIP pixel units Pixel4N. The first power supply voltage signal from VDD_OUT1 included in GOANR is supplied to the (4N−3)th row of MIP pixel units Pixel4N−3; the second power supply voltage signal from VDD_OUT2 included in GOANR is supplied to the (4N−1)th row of MIP pixel units Pixel4N−1.

In the gate driving circuit shown in FIG. 11, the gate driving sub-circuits in one row at the left side and the gate driving sub-circuits in the row on the right side provide a first gate driving signal, a second gate driving signal, and a power supply voltage signal to four rows of MIP pixel units sequentially.

In FIG. 11, CK1 denotes the first control clock signal input end (connected to the gate driving sub-circuit at the left side), CK2 denotes the second control clock signal input end (connected to the gate driving sub-circuit at the left side), CK3 denotes the third control clock signal input end (connected to the gate driving sub-circuit at the left side), CK4 denotes the fourth control clock signal input end (connected to the gate driving sub-circuit at the left side), CK5 denotes the fifth control clock signal input end (connected to the gate driving sub-circuit at the right side), CK6 denotes the sixth control clock signal input end (connected to the gate driving sub-circuit at the right side), CK7 denotes the seventh control clock signal input end (connected to the gate driving sub-circuit at the right side), and CK8 denotes the eighth control clock signal input end (connected to the gate driving sub-circuit at the right side), STV denotes the start signal, VCK denotes the positive phase shift clock signal input end, and VCKB denotes the inverted phase shift clock signal input end. The control signal providing circuit 110 provides a clock signal and the start signal STV, the start signal STV is provided to the input signal end of GOA1L and the input signal end of GOA1R.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A gate driving sub-circuit for driving a memory integrated pixel unit, comprising an input signal end, a shift signal output end, an inverted phase shift signal output end, a positive phase shift clock signal input end, an inverted phase shift clock signal input end, a first control clock signal input end, a second control clock signal input end, a first gate driving signal output end, a second gate driving signal output end, a shift register circuit and a control output circuit, wherein, the control output circuit comprise a first control output sub-circuit and a second control output sub-circuit;

the shift register circuit is configured to obtain an inverted phase shift signal and a shift signal based on an input signal from the input signal end under the control of the positive phase clock signal input end, the inverted phase shift clock signal input end, and a positive phase enable end;

the first control output sub-circuit is configured to generate a first gate driving signal based on the shift signal and the inverted phase shift signal under the control of the first control clock signal input end and a first enable end; and the second control output sub-circuit is configured to generate a second gate driving signal based on the shift signal and the inverted phase shift signal under the control of the second control clock signal input end and an inverted phase enable end, and the second gate driving signal is outputted through the second gate driving signal output end.

2. The gate driving sub-circuit according to claim 1, further comprising a power voltage signal output end and a power voltage signal output circuit, wherein the power supply voltage signal output circuit is connected to the power supply voltage signal output end, the shift signal output end, and a second enable end, and configured to generate a power voltage signal based on the shift signal under the control of the second enable end, and the power voltage signal is outputted through the power voltage signal output end.

3. The gate driving sub-circuit according to claim 2, comprising M control output circuits, M power voltage signal output circuits, M first control clock signal input ends, M second control clock signal input ends, M first gate driving signal output ends, M second gate driving signal output ends, and M power supply voltage signal output ends, wherein M is a positive integer;

the first control output sub-circuit included in one of the M control output circuits is connected to one of the M first control clock signal input ends and one of the M first gate driving signal output ends;

the second control output sub-circuit included in the one of the M control output circuits is connected to one of the M second control clock signal input ends and one of the M second gate driving signal output ends; and one of the M power voltage signal output circuits is connected to one of the M power voltage signal output ends.

4. The gate driving sub-circuit according to claim 2, wherein the power voltage signal output circuit comprises:

a power supply voltage signal output transmission gate, a positive phase control end thereof being connected to the shift signal output end, an inverted phase control end thereof being connected to the inverted phase shift signal output end, and an input end thereof being connected to the second enable end;

a first power voltage signal output transistor, a gate electrode thereof being connected to the shift signal output end, a first electrode thereof being connected to the output end of the power supply voltage signal output transmission gate, and a second electrode thereof being connected to a first voltage input end;

a power supply voltage signal output inverter, an input end thereof being connected to the output end of the power supply voltage signal output transmission gate;

a second power voltage signal output transistor, a gate electrode thereof being connected to the output end of the power supply voltage signal output transmission gate, a first electrode thereof being connected to a second voltage input end, and a second electrode thereof being connected to the power voltage signal output end; and a third power voltage signal output transistor, a gate electrode thereof being connected to the output end of the power voltage signal output inverter, a first electrode thereof being connected to the first voltage input end, and a second electrode thereof being connected to the power voltage signal output end.

5. The gate driving sub-circuit according to claim 1, wherein the shift register circuit comprises:

a first three-state gate, a positive phase control end thereof being connected to the inverted phase shift clock signal input end, an inverted phase control end thereof being connected to the positive phase shift clock signal input end, and an input end thereof being connected to the input signal end;

a shift control transistor, a gate electrode thereof being connected to the positive phase enable end, a first electrode thereof being connected to an output end of the first three-state gate, and a second electrode thereof being connected to a first voltage input end;

a first shift inverter, the input end thereof being connected to the output end of the first three-state gate;

a second three-state gate, a positive phase control end thereof being connected to the positive phase shift clock signal input end, an inverted phase control end thereof being connected to the inverted phase shift clock signal input end, and the input end thereof being connected the output end of the shift inverter, and the output end thereof being connected to the output end of the first three-state gate;

a NAND gate, a first input end thereof being connected to the positive phase shift clock signal input end, and the second input end thereof being connected to the output end of the first shift inverter; and a second shift inverter, an input end thereof being connected to the inverted phase shift end and the output end of the NAND gate, and an output end thereof being connected to a shift output end.

6. The gate driving sub-circuit according to claim 5, wherein the first control output sub-circuit comprises:
a first control output transmission gate, a positive phase control end thereof being connected to the shift signal output end, an inverted phase control end thereof being connected to the inverted phase shift signal output end, and an input end thereof being connected to the first control clock signal input end;
a second control output transmission gate, the positive phase control end thereof being connected to the inverted phase shift signal output end, the inverted phase control end thereof being connected to the shift signal output end, and the input end thereof being connected to the first enable end;
a first control output inverter, the input end thereof being connected to the output end of the first control output transmission gate and the output end of the second control output transmission gate; and
a second control output inverter, the input end thereof being connected to the output end of the first control output inverter, and the output end thereof being connected to the first gate driving signal output end.

7. The gate driving sub-circuit according to claim 6, wherein the second control output sub-circuit comprises:
a third control output transmission gate, a positive phase control end thereof being connected to the shift signal output end, an inverted phase control end thereof being connected to the inverted phase shift signal output end, and an input end thereof being connected to the second control clock signal input end;
a fourth control output transmission gate, a positive phase control end thereof being connected to the inverted phase shift signal output end, an inverted phase control end being connected to the shift signal output end, and the input end thereof being connected to the inverted phase enable end;
a third control output inverter, an input end thereof being connected to the output end of the third control output transmission gate and the output end of the fourth control output transmission gate; and
a fourth control output inverter, an input end thereof being connected to the output end of the third control output inverter, and an output end thereof being connected to the second gate driving signal output end.

8. The gate driving sub-circuit according to claim 1, further comprising an input circuit, wherein the input circuit is connected to a forward scan control end, a reverse scan control end, a positive phase shift signal end, an inverted phase shift signal end, and the input signal end, and is configured to control the positive phase shift signal end or the inverted phase shift signal end to be connected to the input signal end under the control of the forward scan control end and the reverse scan control end.

9. The gate driving sub-circuit according to claim 8, wherein the input circuit comprises:
a forward scan transmission gate, a positive phase control end thereof being connected to the forward scan control end, the inverted phase control end thereof being connected to the reverse scan control end, an input end thereof being connected to the positive phase shift signal end, and an output end thereof being connected to the input signal end; and
a reverse scan transmission gate, a positive phase control end thereof being connected to the reverse scan control end, an inverted phase control end thereof being connected to the forward scan control end, an input end thereof being connected to the inverted phase shift signal end, and an output end thereof being connected the input signal end.

10. A method of driving the gate driving sub-circuit according to claim 1, comprising:
obtaining, by the shift register circuit, the inverted phase shift signal and the shift signal according to an input signal from the input signal end under the control of the clock signal input end and the positive phase enable end, the inverted phase shift signal being inverted to the shift signal phase;
generating, by the first control output sub-circuit, a first gate driving signal according to the shift signal and the inverted phase shift signal under the control of the first control clock signal input end and the first enable end, and outputting the first gate driving signal through the first gate driving signal output end; and
generating, by the second control output sub-circuit, a second gate driving signal according to the shift signal and the inverted phase shift signal under the control of the second control clock signal input end and the inverted phase enable end, and outputting the second gate driving signal through the second gate driving signal output end.

11. The method according to claim 10, further comprising:
generating, by a power voltage signal output circuit, a power voltage signal according to the shift signal under the control of a second enabling end, and outputting the power voltage signal through the power supply voltage signal output end.

12. A gate driving circuit, comprising a first gate driving modules arranged on a first side of a display panel and a second gate driving modules arranged on a second side of the display panel connected in a cascade manner, wherein,
the first gate driving module comprises a plurality of gate driving sub-circuits according to claim 1 connected in a cascade manner;
the second gate driving module comprises a plurality of gate driving sub-circuits according to claim 1 connected in a cascade manner; and
the plurality of gate driving sub-circuits included in the first gate driving module is connected to memory integrated pixel units located in odd-numbered rows, the plurality of gate driving sub-circuits included in the second gate driving module is connected to memory integrated pixel units located in even-numbered rows.

13. The gate driving circuit according to claim 12, wherein the first side is a left side, and the second side is a right side; or the first side is the right side, and the second side is the left side;
the positive phase shift clock signal input end of the shift register circuit in the first gate driving module is connected to the positive phase clock signal line, and the inverted phase shift clock signal input end of the shift register circuit in the first gate driving module is connected to the inverted phase clock signal line; the positive phase shift clock signal input end of the shift register circuit in the second gate driving module is connected to the inverted phase clock signal line, and the inverted phase shift clock signal input end of the shift register circuit in the second gate driving module is connected to the positive phase clock signal line;
each gate driving sub-circuit of the plurality of gate driving sub-circuits further comprises a positive phase shift signal end, an inverted phase shift signal end and an input circuit, the input circuit is connected to a forward scan control end, a reverse scan control end, the positive phase shift signal end, the inverted phase shift signal end, and the input signal end, and is configured to control the positive phase shift signal end or the inverted phase shift signal end to be connected to the input signal end under the control of the forward scan control end and the reverse scan control end; and in the first gate driving module and the second gate driving module, other than a first gate driving sub-circuit, a positive phase shift signal end of a current gate driving sub-circuit is connected to a shift signal output end of an adjacent previous gate driving sub-circuit; and other than a last gate driving sub-circuit, an inverted phase shift signal end of the current gate driving sub-circuit is connected to a shift signal output end of an adjacent next gate driving sub-circuit.

14. The gate driving circuit according to claim 12, wherein the gate driving sub-circuit comprises M power voltage signal output ends; M is a positive integer.

15. The gate driving circuit according to claim 14, wherein when M is equal to 1, an nth stage of gate driving sub-circuit included in the first gate driving module includes a power voltage signal output end for supplying a power voltage signal to the memory integrated pixel unit in a 2nth row; the nth gate driving sub-circuit included in the second gate driving module includes a power voltage signal output end for supplying a power voltage signal to the memory integrated pixel unit in a (2n−1)th row, n is a positive integer.

16. The gate driving circuit according to claim 14, wherein when M is equal to 2, the nth stage of gate driving sub-circuit included in the first gate driving module includes a first power voltage signal output end for supplying a power voltage signal to the memory integrated pixel unit in a (4n−2)th row; the nth stage of gate driving sub-circuit included in the first gate driving module includes a second power voltage signal output end for supplying a power voltage signal to the memory integrated pixel unit in a 4nth row; the first stage of gate driving sub-circuit included in the second gate driving module includes a power voltage signal output end for supplying a power voltage signal to the memory integrated pixel unit in a (4n−3)th row; the second stage of gate drive sub-circuit included in the second gate driving module includes a supply voltage signal output for providing a supply voltage signal to the memory integrated pixel unit in a (4n−1)th row, where n is a positive integer.

* * * * *